(12) United States Patent
Iijima

(10) Patent No.: US 7,811,895 B2
(45) Date of Patent: Oct. 12, 2010

(54) METHOD OF MANUFACTURING A SEMICONDUCTOR DEVICE HAVING A STACKED CAPACITOR

(75) Inventor: Shinpei Iijima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/464,209

(22) Filed: May 12, 2009

(65) Prior Publication Data

US 2009/0221127 A1 Sep. 3, 2009

Related U.S. Application Data

(62) Division of application No. 11/268,558, filed on Nov. 8, 2005, now abandoned.

(30) Foreign Application Priority Data

Nov. 15, 2004 (JP) ............................. 2004-330715

(51) Int. Cl.
*H01L 21/20* (2006.01)
(52) U.S. Cl. ............... 438/396; 438/387; 257/E21.546; 257/E21.548; 257/E21.645
(58) Field of Classification Search ................. 438/396, 438/387; 257/303, 532, 352
See application file for complete search history.

(56) References Cited

U.S. PATENT DOCUMENTS

2002/0190294 A1  12/2002  Iizuka et al.

2003/0096473 A1 *  5/2003  Shih et al. ................... 438/240
2003/0148581 A1 *  8/2003  Kim et al. .................... 438/253
2004/0071879 A1 *  4/2004  Callegari et al. ........ 427/255.28
2004/0106252 A1   6/2004  Jeong et al.
2004/0137678 A1   7/2004  Cho et al.
2006/0086961 A1   4/2006  Iijima et al.

FOREIGN PATENT DOCUMENTS

| JP | 2000-012796 | 1/2000 |
| JP | 2002-373945 | 12/2002 |
| JP | 2004-214602 | 7/2004 |
| JP | 2004-311937 | 11/2004 |

OTHER PUBLICATIONS

Japanese Patent Office issued a Japanese Office Action dated Jan. 7, 2010, Application No. 2004-330715.

* cited by examiner

*Primary Examiner*—A. Sefer
(74) *Attorney, Agent, or Firm*—Young & Thompson

(57) ABSTRACT

A stacked capacitor in a memory cell has a bottom electrode made of a metal or metal compound, a capacitor insulation film and a top electrode made of a metal or a metal compound. The capacitor insulation film includes an aluminum oxide film having a thickness of 2 to 4 nm and in contact with the bottom electrode, and an overlying hafnium oxide film having a thickness of 3 to 6 nm. The stacked capacitor has a higher resistance against a biased temperature test.

6 Claims, 14 Drawing Sheets

METHOD OF MANUFACTURING A SEMICONDUCTOR DEVICE HAVING A STACKED CAPACITOR

BACKGROUND OF THE INVENTION (a) Field of the Invention

The present invention relates to a semiconductor device having a stacked capacitor and, more particularly, to a technique for reducing dimensions of a semiconductor device having a stacked capacitor while assuring a higher capacitance of the stacked capacitor. The present to invention also relates to a method for manufacturing such a semiconductor device.

(b) Description of the Related Art

Semiconductor devices have been developed to reduce the dimensions and increase the scale and functions thereof. In particular, DRAM devices now on the market have a capacity of giga-bit order with a reduced design rule of 110 nm (F110-rule), and next-generation DRAM devices will have such an order of capacity with a further reduced design rule of 90 nm (F90-rule). In such a development of finer design rule, a stacked capacitor used in each memory cell of the DRAM device also has reduced dimensions, which makes it difficult for the stacked capacitor to have a required capacitance.

In a F110-rule DRAM device, a technique for achieving a higher capacitance and a finer design rule in the stacked capacitor generally uses a HSG (Hemispherical Silicon Grain), wherein the top and bottom electrodes in the capacitor have a larger opposing area therebetween. However, in the F90-rule DRAM device, it is difficult to use the HSG structure due to the finer design rule, wherein the polysilicon bottom electrode is not allowed to have the HSG structure because of the difficulty in formation of the hemispherical grains on the surface thereof.

Another technique for achieving a higher capacitance and a finer design rule in the stacked capacitor is such that a capacitor insulation film is made of tantalum oxide having a higher dielectric constant compared to the silicon oxide generally used heretofore. However, the tantalum oxide has a problem of occurring of silicon oxynitride film having a lower dielectric constant, after the silicon electrode reacts with an adjacent tantalum oxide film in a heat treatment conducted for reducing a leakage current in the capacitor.

The silicon oxynitride is formed in an oxidizing atmosphere of the heat treatment, after formation of silicon nitride due to reaction between the silicon electrode and the tantalum oxide film. The resultant silicon oxynitride has a thickness of around 3.5 to 4.0 nm, for example, and reduces the capacitance of the stacked capacitor due to the lower dielectric constant thereof. The technique using the tantalum nitride film in the stacked capacitor is described in JP-A-2000-12796, for example.

DISCLOSURE OF THE INVENTION (a) Object of the Invention

The present inventor noticed aluminum oxide in the study for achieving a thin capacitor insulation film in the stacked capacitor. Use of the aluminum oxide obviates a heat treatment for achieving a lower leakage current and thus provides a smaller thickness as small as 1 nm or smaller for the low-dielectric-constant film, which is generally formed on a silicon surface by oxidization thereof. This allows the capacitor insulation film to have a smaller thickness by 2.5 nm or more compared to the case of using the tantalum oxide as the capacitor insulation film.

There is a problem in the aluminum oxide used in the capacitor insulation film, however, that the aluminum oxide has a lower resistance against a BT (biased-temperature) stress at high temperatures and has a larger leakage current after the BT test due to degradation in the characteristic thereof after the BT test.

In view of the above, it is an object of the present invention to provide a semiconductor device including a stacked capacitor having a capacitor insulation film, which is capable of suppressing degradation of the characteristics in the capacitor insulation film and suppressing increase in the leakage current generally caused by the BT test of the semiconductor device.

It is another object of the present invention to provide a method for manufacturing such a semiconductor device.

SUMMARY OF THE INVENTION

The present invention provides, in a first aspect thereof, a semiconductor device including a stacked capacitor having a bottom electrode, a capacitor insulation film and a top electrode consecutively deposited, wherein: each of the bottom and top electrodes includes a metal or a metal compound; and the capacitor insulation film includes an aluminum oxide film having a thickness of 2 to 5 nm and disposed in contact with the bottom electrode.

The present invention provides, in a second aspect thereof, a semiconductor device including a stacked capacitor having a bottom electrode, a capacitor insulation film and a top electrode consecutively deposited, wherein: each of the bottom and top electrodes includes a metal or a metal compound; and the capacitor insulation film has a three-layer structure including a first aluminum oxide film, a hafnium oxide film and a second aluminum oxide film consecutively deposited.

The present invention provides, in a third aspect thereof, a method for manufacturing a stacked capacitor in a semiconductor device, the method consecutively including: forming a bottom electrode including a metal or a metal compound overlying a substrate; forming a capacitor insulation film including an aluminum oxide film on the bottom electrode, the aluminum oxide film having a thickness of 2 to 5 nm; and forming a top electrode including a metal or a metal compound on the capacitor insulation film.

The present invention provides, in a fourth aspect thereof, a method for manufacturing a stacked capacitor in a semiconductor device, consecutively including: forming a bottom electrode including a metal or a metal compound overlying a substrate; forming a capacitor insulation film on the bottom electrode, the capacitor insulation film including a first aluminum oxide film, a hafnium oxide film and a second aluminum oxide film in this order as viewed from the bottom electrode; and forming a top electrode including a metal or a metal compound on the capacitor insulation film.

In accordance with the semiconductor device of the present invention and the semiconductor device manufactured by the method of the present invention, due to obviation of the heat treatment for reducing the leakage current in the aluminum oxide film, the aluminum oxide film is free from a low-dielectric-constant material and thus provides a higher capacitance to the stacked capacitor. In addition, the metal or metal compound of the bottom electrode prevents the aluminum oxide film from generating a depletion layer in the adjacent bottom electrode to thereby suppress degradation of the capacitor insulation film and thus improve the reliability of the capacitor after a BT test.

The above and other objects, features and advantages of the present invention will be more apparent from the following description, referring to the accompanying drawings.

PREFERRED EMBODIMENTS OF THE INVENTION

Before describing the preferred embodiments of the present invention, the principle of the present invention will be described hereinafter with reference to the conventional semiconductor device.

The present inventor manufactured samples of conventional semiconductor devices having a capacitor insulation film made of tantalum oxide and having a capacitor insulation film made of aluminum oxide, which were subjected to evaluation of the characteristics thereof.

Figure 1:
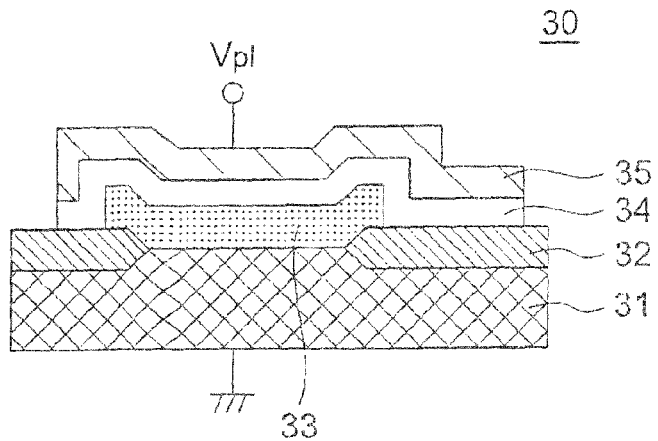
FIG. 1 is a sectional view of a conventional semiconductor device including a stacked capacitor having a tantalum oxide film.
Figure 2:
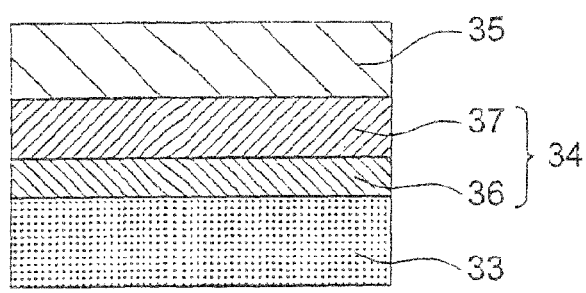
FIG. 2 is a schematic sectional view of the stacked capacitor shown in FIG. 1.

FIG. 1 shows the structure of the semiconductor device having the tantalum oxide film as the capacitor insulation film. FIG. 2 schematically shows the layered structure of the capacitor in the semiconductor device of FIG. 1. The semiconductor device 30 of FIG. 1 includes an n-type silicon substrate (n-substrate) 31, a LOCOS film 32 made of thick silicon oxide formed on the n-substrate 31 for isolation of the surface region of the n-substrate 31. On the n-substrate 31, there are provided a bottom electrode 33, a capacitor insulation film 34 and a top electrode 35, which are consecutively deposited on the n-substrate 31 in this order. The bottom electrode 33 and the top electrode 35 are made of polysilicon and titanium nitride, respectively. The capacitor insulation film 34 includes silicon oxynitride 36 and overlying tantalum oxide 37.

The process for manufacture of the samples of the conventional semiconductor device of FIG. 1 included the steps of forming the LOCOS film 32 on the n-substrate 31, depositing a polysilicon to form the bottom electrode 33, and heat treating the bottom electrode 33 at a temperature of 750 degrees C., and depositing 1-nm-thick silicon nitride on the surface of the bottom electrode 33. Thereafter, 8-nm-thick tantalum oxide 37 is deposited by a CVD technique using $Ta(OC_2H_5)_5$ and oxygen as a source gas.

The resultant device is then subjected to a heat treatment at a temperature of 780 degrees C. for three minutes. This heat treatment allows the surface of the silicon nitride and the polysilicon bottom electrode 33 to be oxidized to form a silicon oxynitride 36 having a thickness of 3.5 to 4.0 nm on the bottom surface of the tantalum oxide 37. Thereafter, titanium nitride is deposited thereon by a CVD process using titanium tetrachloride and ammonium as a source gas at a temperature of 500 degrees C. to form the top electrode 35. The capacitor insulation film 34 was then measured in terms of the equivalent oxide thickness (EOT) by using the capacitance-voltage characteristic of the resultant capacitor, to exhibit an EOT of 4.8 nm. The EOT was obtained from the capacitance at −1 volt on the capacitance-voltage characteristic, as in the following measurements.

Then, using one of the samples, the n-substrate 31 was grounded, the top electrode 35 was applied with a potential Vp1 which was changed from −5 volts to +5 volts, and a leakage current was measured between the top electrode 35 and the bottom electrode 33 for each applied potential. In this measurement of the leakage current, an initial leakage current characteristic was measured at room temperature, followed by biasing or raising the substrate temperature up to 90 degrees C., and lowering the substrate temperature down to the room temperature.

Figure 3:
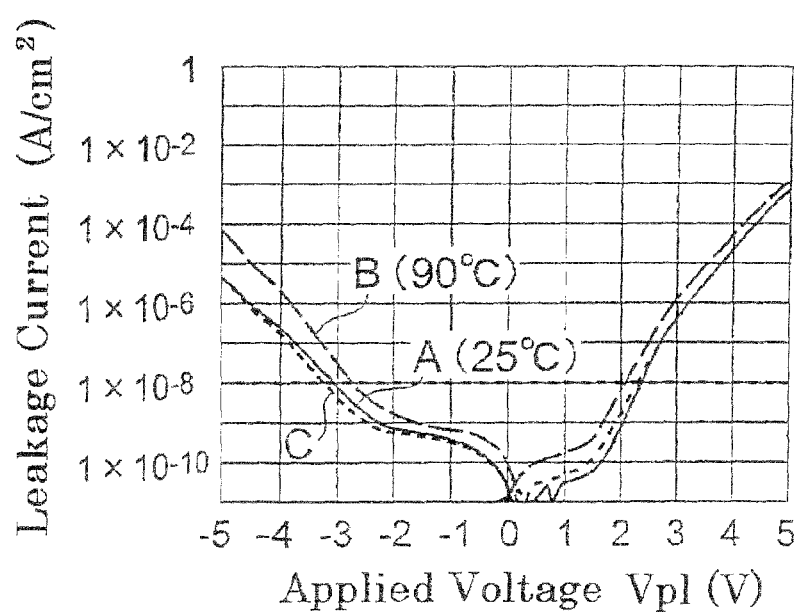
FIG. 3 is a graph showing the relationship between the applied voltage and the leakage current in a sample of the stacked capacitor of FIG. 2 at different temperatures.

FIG. 3 shows the results of the above-described measurements, wherein the applied voltage Vp1 is plotted on the abscissa, and the leakage current per unit area is plotted on the ordinate. Graph A shows the initial leakage current characteristic measured at room temperature, graph B shows the leakage current characteristic measured at a high temperature (90 degrees C.), and graph C shows the leakage current characteristic measured again at room temperature. In FIG. 3, the leakage current increases from graph A to graph B, and reduces from graph B to graph C which is substantially same as graph A, showing occurring of no degradation in the capacitor insulation film.

Figure 4:
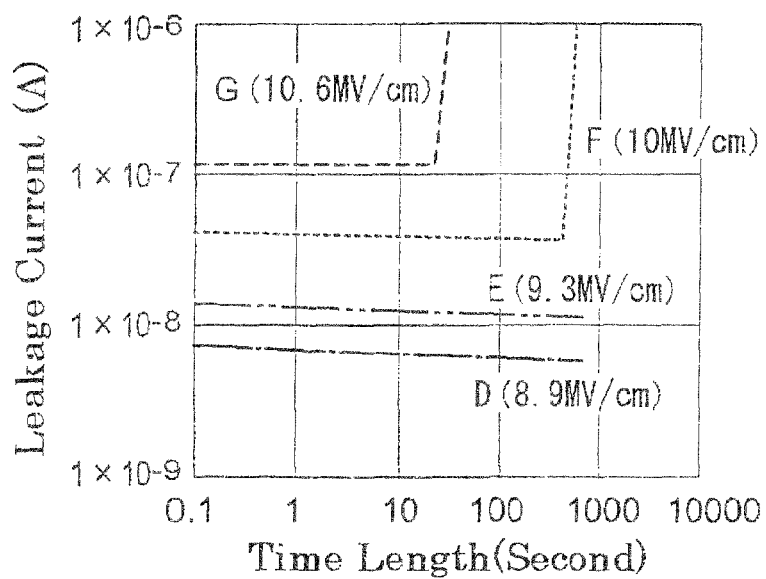
FIG. 4 is a graph showing the relationship between the time length of voltage application and the leakage current in a BT test of samples of the capacitor of FIG. 2.

Other samples of the semiconductor device 30 were subjected to a BT test, wherein the top electrode 35 was applied with a specific negative potential, with the n-substrate 31 being grounded, at a temperature of 120 degrees C., and the leakage current characteristic was measured with respect to the elapsed time length. FIG. 4 shows the results of the measurements wherein the time length is plotted on the abscissa, and the leakage current is plotted on the ordinate. Graphs D to G shown tin FIG. 4 represent the results of the measurements at specific electric fields shown therein. The electric field is calculated by dividing the applied voltage Vp1 by the EOT of the capacitor insulation film. As shown in FIG. 4, the samples of graphs F and G failed in the breakdown of capacitor insulation film at around the time instants of 400 seconds and 20 seconds, respectively, after the start of the BT test. The other samples D and E, which did not fail in the BT test, had a stable leakage current and exhibited no characteristic degradation.

Figure 5:
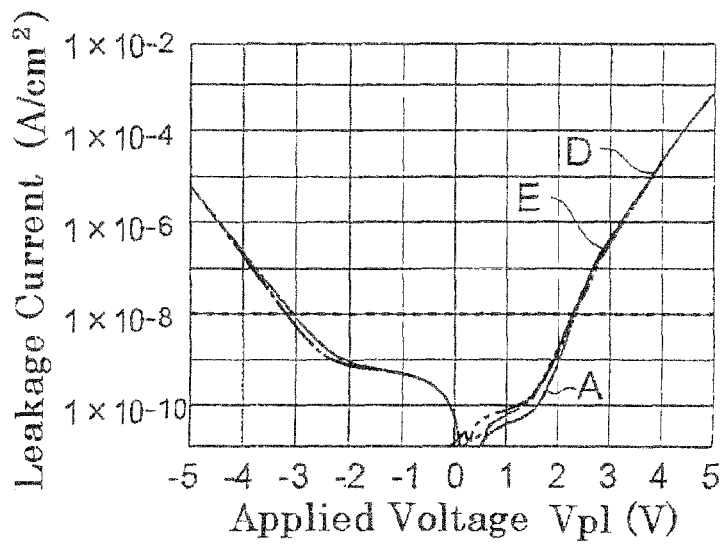
FIG. 5 is a graph showing the applied voltage and the leakage current in a recovery test after the BT test for the samples of capacitor of FIG. 2.

The samples D and E, which did not fail in the BT test, were subjected to the recovery test after the BT test similarly to the one of the samples as described before. The results of the measurements are shown in FIG. 5, wherein the results of the measurement of the samples D and E substantially coincided with the initial leakage current characteristic represented by graph A, which is extracted from FIG. 3, thereby exhibiting no degradation in the capacitor insulation film.

Figure 6:
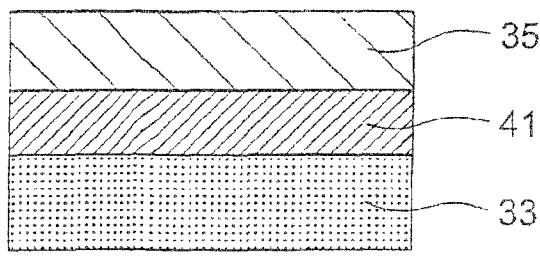
FIG. 6 is a schematic sectional view of a stacked capacitor in a conventional semiconductor device.

FIG. 6 shows the layered structure of a capacitor having an aluminum oxide film as the capacitor insulation film in a capacitor. The stacked capacitor 40 shown therein has a structure similar to that shown in FIG. 2 except that the capacitor insulation film is configured by a 4-nm-thick aluminum oxide film in FIG. 6. In manufacture of the stacked capacitor 40 of FIG. 6, polysilicon is deposited to form the bottom electrode 33, 4-nm-thick aluminum oxide 41 is deposited to form the capacitor insulation film, and titanium nitride is then deposited thereon using a CVD technique to form the top electrode 35.

The deposition of the aluminum oxide 41 is conducted using a pulse-deposition process wherein supply and discharge of an aluminum source gas and supply and discharge of an oxidation agent are alternately executed to deposit the aluminum oxide in an atomic-layer deposition (ALD) technique. The aluminum source may be trimethyl-aluminum (TMA), for example, and the oxidation agent may be ozone, for example. The resultant capacitor insulation film had an EOT of 3.64 nm, which is 24% smaller than the EOT of the capacitor insulation film having tantalum oxide and shown in FIG. 2.

Figure 7:
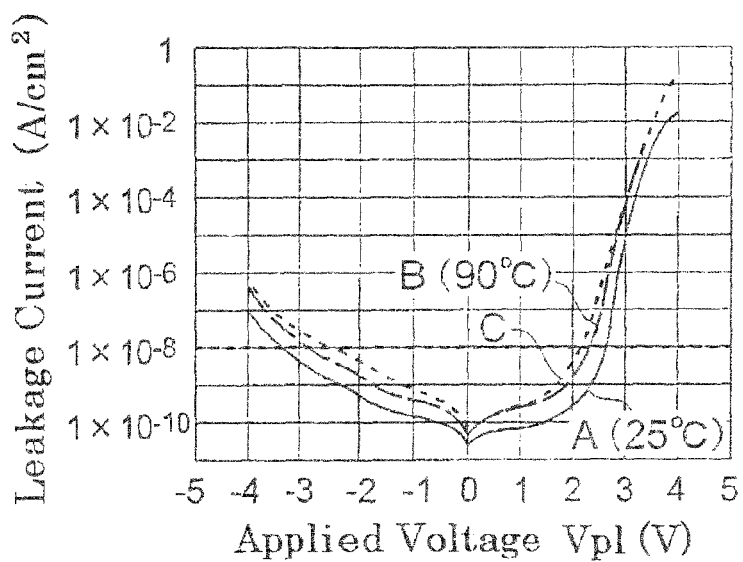
FIG. 7 is a graph showing the relationship between the applied voltage and the leakage current in a sample of the capacitor of FIG. 6 at different temperatures.

Samples of the semiconductor device having the stacked capacitor 40 shown in FIG. 6 were manufactured and one of them was subjected to measurement in the leakage current characteristics, similarly to the measurements of which results are shown in FIG. 3. FIG. 7 shows the results of the measurements for the present sample. Graph B representing the leakage current characteristic at a high temperature exhibits a larger leakage current than graph A representing the initial leakage current characteristic, and graph C representing the leakage current characteristic obtained at room temperature after the high-temperature measurement does not coincide with graph A. These results showed a degradation of the sample of the stacked capacitor 40 including the capacitor insulation film made of aluminum oxide.

Figure 8:
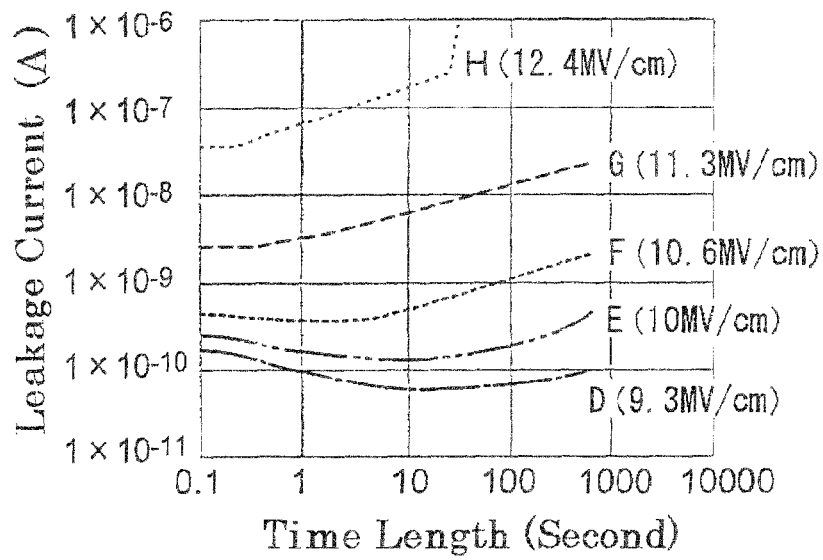
FIG. 8 is a graph showing the relationship between the time length for voltage application and the leakage current in a BT test of samples of the capacitor of FIG. 6.

Other samples of the semiconductor device having a stacked capacitor 40 were subjected to a BT test similar to the BT test of which results are shown in FIG. 4. FIG. 8 shows the results of the BT test for these samples. Graphs D to H show the results of the measurements when the samples are applied with specific electric fields shown in FIG. 8. As understood from FIG. 8, the sample of graph H failed after a time length of 20 seconds, whereas other samples did not fail within the test period. However, all the samples showed a tendency of gradual rise in the leakage current, exhibiting an unstable leakage current during the test period.

Figure 9:
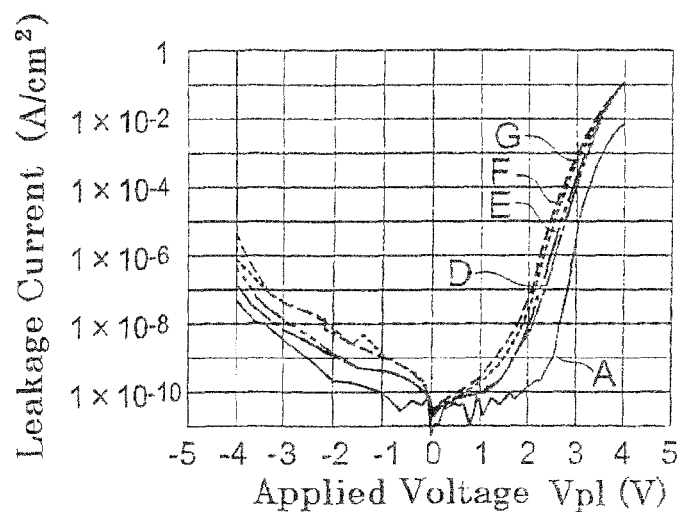
FIG. 9 is graph showing the relationship between the applied voltage and the leakage current in the recovery test after the BT test for the samples of the capacitor of FIG. 6.

The samples of graphs D to G, which did not fail in the BT test, were then subjected to measurement of the leakage current characteristic in the recovery test after the BT test. The results are shown in FIG. 9. It will be understood from FIG. 9 that the leakage current characteristic of the samples of graphs D to G did not recover the initial leakage current characteristic shown by graph A, exhibiting degradation of these samples of the semiconductor device having the stacked capacitor 40.

The leakage current characteristic shown by graphs D to G in FIG. 9 significantly increased depending on the magnitude of the applied electric field. This is typically shown for the sample of graph D, which did not exhibit a significant increase in the results of BT test shown in FIG. 8 and yet exhibited a significant increase in the results shown in FIG. 9. The increase of the leakage current also depended on the time length for the application of the electric field, whereby the leakage current increased with the increase of the applied time length for the same electric field. The results of FIGS. 7 and 8 clarified that the degradation of the semiconductor device resulted from the degradation of the aluminum oxide film during application of the electric field at a high temperature. This degradation also occurred in the case of a layered structure of the capacitor insulation film including aluminum oxide and hafnium oxide, i.e., so long as the layered structure included aluminum oxide.

Figure 10:
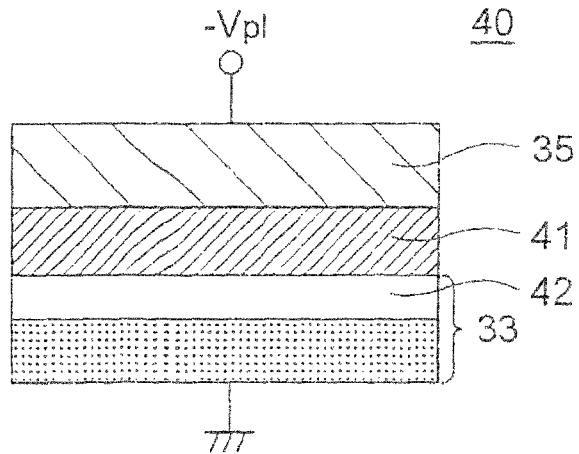
FIG. 10 is a schematic sectional view of the capacitor of FIG. 6 in the case of applying a negative voltage to the top electrode with respect to the bottom electrode.

It was noted that the degradation of the stacked capacitor 40 occurred in the case where a negative potential was applied to the top electrode 35 with respect to the bottom electrode 33, and not occurred in the case where a positive potential was applied to the top electrode 35. FIG. 10 shows the case where a negative potential −Vp1 is applied to the top electrode 35 in the stacked capacitor 40, wherein a depletion layer 42 appears in the bottom electrode 33 configured by a n-type polysilicon film. The present inventor conceived that this depletion layer 42 incurred the above degradation in the stacked capacitor 40. It was also noted that the stacked capacitor 30 including tantalum oxide also had a depletion layer in the bottom electrode and yet the stacked capacitor 30 did not exhibit the degradation. Thus, the present inventor noticed the negative charge in the aluminum oxide 41 as the cause of the degradation occurring only in the stacked capacitor 40.

The presence of the negative charge in the aluminum oxide is evident from the capacitance-voltage characteristic of a MOS capacitor having an aluminum oxide film as the capacitor insulation film. It is known that the MOS capacitor having an aluminum oxide capacitor insulation film has a capacitance-voltage characteristic which is shifted from the capacitance-voltage characteristic of a MOS capacitor having a silicon oxide capacitor insulation film by an amount of 1 volt or more toward the positive potentials.

The fact that the capacitance-voltage characteristic is shifted toward the positive potentials by 1 volt or more means that the bottom electrode of the stacked capacitor having the aluminum oxide in the capacitor insulation film has an accumulated charge on the surface thereof only when the top electrode is applied with a positive potential of 1 volt or more, whereas the bottom electrode of the stacked capacitor having the silicon oxide in the capacitor insulation film has an accumulated charge on the surface thereof even when the top electrode is not applied with such a potential. In other words, the n-type polysilicon bottom electrode of the stacked capacitor having the aluminum oxide in the capacitor insulation film has a depletion layer thereon in the normal state where the top electrode is not applied with a positive potential. Thus, it is probable that the aluminum oxide inherently has a negative charge therein which is substantially equal to the negative charge that is necessary to form a depletion layer in the bottom electrode 35.

The reason of presence of the negative charge in the aluminum oxide film is not yet clarified; however, it is highly probable that the negative charge originates from the negative ions such as $Al(OH)_3^-$ that is a precursor of $Al_2O_3$. If this is the case, the capacitor insulation film may include therein negative ions immediately after forming the capacitor, thereby maintaining the balance for suppressing the leakage current. When a negative potential is applied to the top electrode, a depletion layer is formed in the surface region of the bottom electrode, the depletion layer including therein a fixed positive charge which attracts the negative ions from the aluminum oxide in association with the electric field formed therein. This will generate a structural change in the aluminum oxide, forming therein a leakage current path which disrupted the balance suppressing the leakage current.

In the stacked capacitor 40, a heat treatment at a temperature of 750 degrees C. or above, if performed after forming the aluminum oxide 41, can extinguish the negative ions in the aluminum oxide film 41. However, such a heat treatment should not be performed for the stacked capacitor 40 because the stacked capacitor is generally formed after forming diffused regions and metallic contacts in transistors which are susceptible to the heat treatment. Thus, the present inventor concluded that degradation of the stacked capacitor having the aluminum oxide could not be avoided, so long as the capacitor has a MIS structure including a silicon bottom electrode.

There is a known technique that the gate insulation film of a MOS transistor formed on a single-crystal silicon substrate has a layered structure including aluminum oxide and hafnium oxide. In this structure, since the amount of charge in the gate insulation film fluctuates due to the presence of the negative ions in the aluminum oxide, it is difficult to control the threshold voltage of the MOS transistor, which is generally the most essential factor. This problem can be solved in such a MOS transistor by using a heat treatment for the aluminum oxide to extinguish the negative charge therein, because the process for forming the gate insulation film is conducted at an initial stage of the fabrication process for the MOS transistor and the heat treatment can be conducted at any desired conditions substantially without incurring such a problem as encountered in the stacked capacitor.

In consideration of the above facts, the present inventors conceived use of a metal or metal compound instead of the polysilicon as a material for the bottom electrode for avoiding the problem of the depletion layer. In this concept, it was noted that the aluminum oxide does not necessitate a heat treatment for reduction of the leakage current in an oxidizing atmosphere, and thus oxidation of the bottom electrode can be avoided even if it is made from a metal or metal compound. It is conceived here that use of the metal or metal compound, which eliminates the depletion layer in the bottom electrode, may suppress the degradation of the capacitor insulation film after the BT test. Thus, samples of semiconductor device including a bottom electrode having therein titanium nitride were manufactured and subjected to a first experiment for evaluation of the performance thereof.

Figure 11:
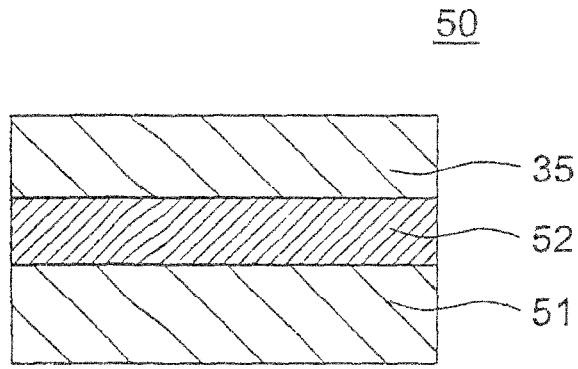
FIG. 11 is a schematic sectional view of a stacked capacitor used in a first experiment of the present invention.

FIG. 11 shows a layered structure of a capacitor in a semiconductor device, the samples of which were manufactured as described above. The layered structure of the capacitor 50 shown in FIG. 11 is similar to the layered structure of the capacitor 40 shown in FIG. 6 except that the bottom electrode 51 is made of titanium nitride and the capacitor insulation film 52 is made of aluminum oxide having a thickness of 5 nm in FIG. 11.

Figure 12:
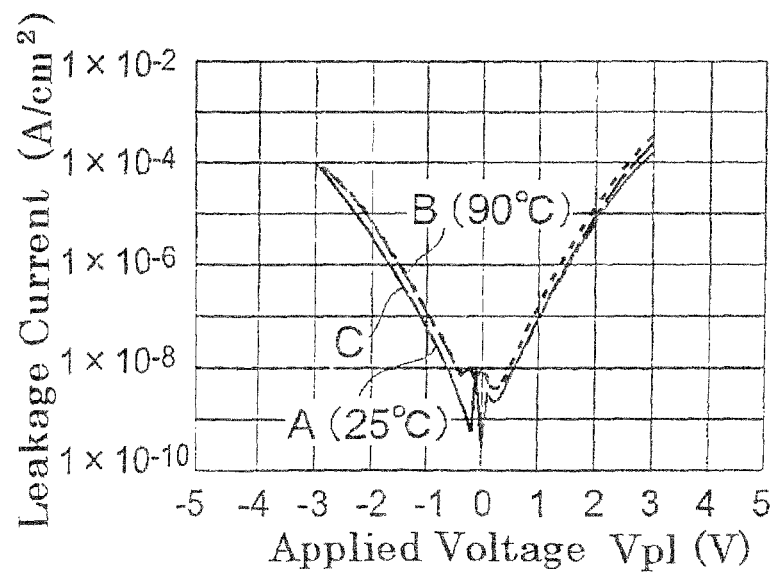
FIG. 12 is a graph showing the relationship between the applied voltage and the leakage current in a sample of the first experiment at different temperatures.

One of the samples of the semiconductor device having the capacitor 50 shown in FIG. 11 was subjected to measurement in the leakage current to obtain the leakage current characteristics similar to those shown in FIG. 3. FIG. 12 shows the results of this measurement. As understood from FIG. 12, the leakage current characteristic in the To recovery test shown by graph C is similar to the initial leakage current characteristic shown by graph A, thereby exhibiting no degradation of the capacitor insulation film.

Figure 13:
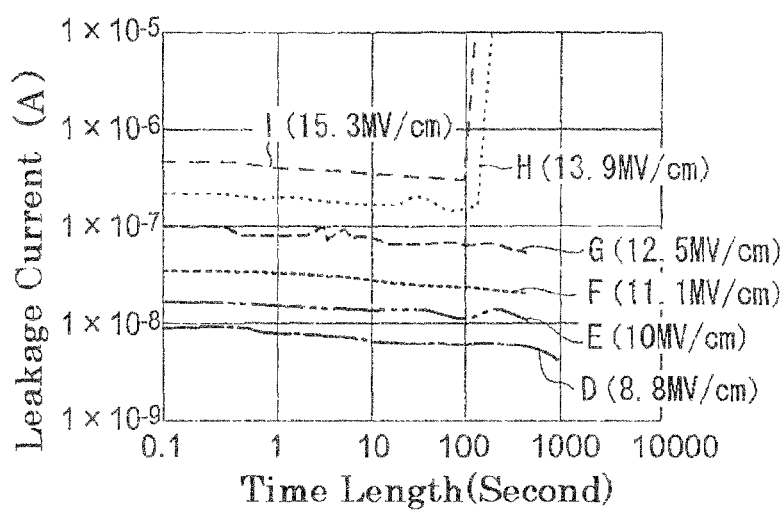
FIG. 13 is a graph showing the relationship between the time length for voltage application and the leakage current in a BT test of samples of the first experiment.

Other samples of the semiconductor device having the capacitor 50 were subjected to a BT test similar to the BT test of which results are shown in FIG. 4. FIG. 13 shows the results of this BT test. Graphs D to I show the leakage current characteristic with respect to time length upon application of the specific electric fields shown therein. The samples of graphs H and I failed after a time length of around 100 seconds since the start of the BT test, whereas the other samples did not fail in the BT test. These samples, irrespective of occurring of a failure or non-failure in the capacitor insulation film, exhibited a stable leakage current characteristic during the test period.

Figure 14:
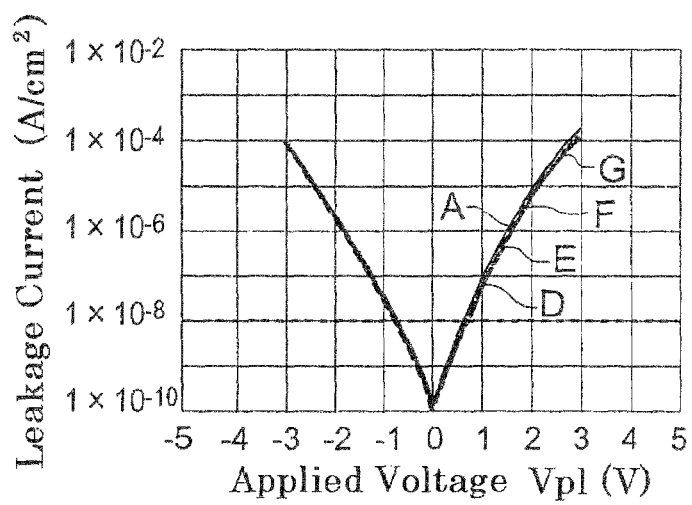
FIG. 14 is a graph showing the relationship between the applied voltage and the leakage current in the recovery test after the BT test in the samples of the first experiment.

The samples of graphs D to G, which did not fail in the above BT test, were subjected to a recovery test similar to the recovery test of which results are shown in FIG. 5. The results of the measurement in the recovery test are shown in FIG. 14. All these samples recovered the initial leakage current shown by graph A, thereby revealing no degradation in the capacitor insulation film.

Figure 15:
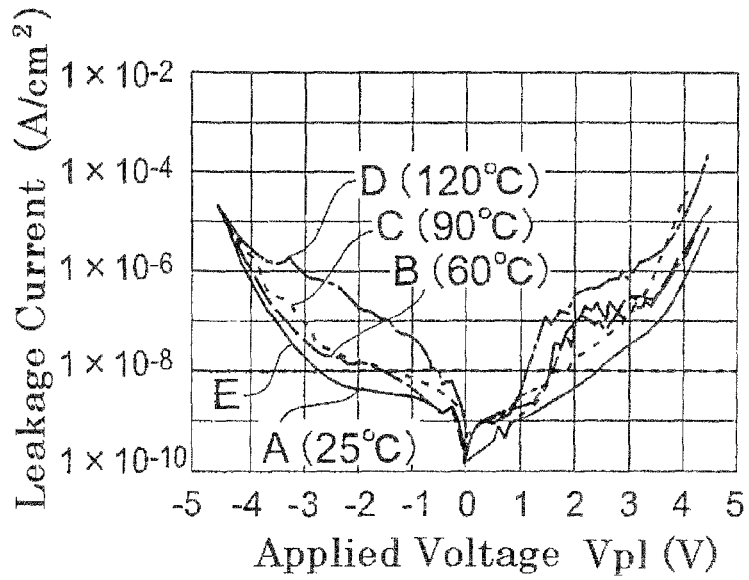
FIG. 15 is a graph showing the relationship between the applied voltage and the leakage current in a sample of a second experiment of the present invention at different temperatures.

Next samples of semiconductor device including the capacitor 50 having 7-nm-thick aluminum oxide were manufactured and subjected to measurement in the leakage current for a second experiment. The results of the measurement of one of the samples in the leakage current at different temperatures are shown in FIG. 15. In this measurement, the leakage current of the sample was measured: at to room temperature (graph A); at a high temperature of 60 degrees C. (graph B), at a higher temperature of 90 degrees C. (graph C), and at a further higher temperature of 120 degrees C. (graph D); and again at room temperature (graph E) after the higher temperatures. As understood from FIG. 15, the leakage current was significantly reduced from the samples of the semiconductor device having a 5-nm-thick aluminum oxide film. However, as shown by graphs B to D, the leakage current was unstably increased along with the rise of the ambient temperature as well as along with the rise of the applied voltage, revealing an unstable leakage current characteristic of the samples.

Figure 16:
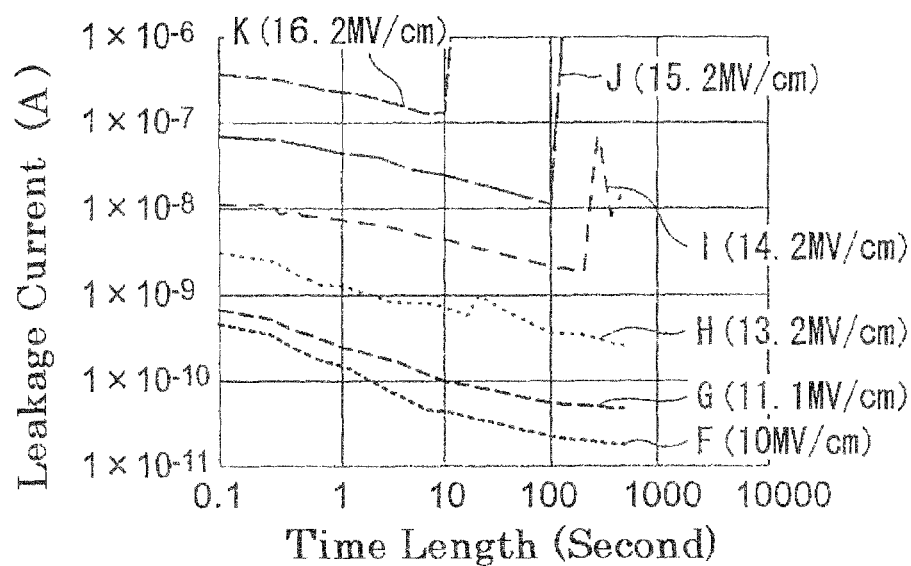
FIG. 16 is a graph showing the relationship between the time length for voltage application and the leakage current in a BT test of samples of the second experiment.

In the second experiment, other samples were subjected to a BT test similar to the BT test of which results are shown in FIG. 4. FIG. 16 shows the results of the BT test for the other samples. Graphs F to K show the leakage current characteristic upon application of specific electric fields shown in FIG. 16. In the same drawing, the samples of graphs J and K failed at above an electric field of 15.2 MV/cm. These samples, irrespective of occurring of a failure or non-failure, exhibited reduction of the leakage current along with the elapsed time length, and did not exhibit an increase of the leakage current during the test period.

Figure 17:
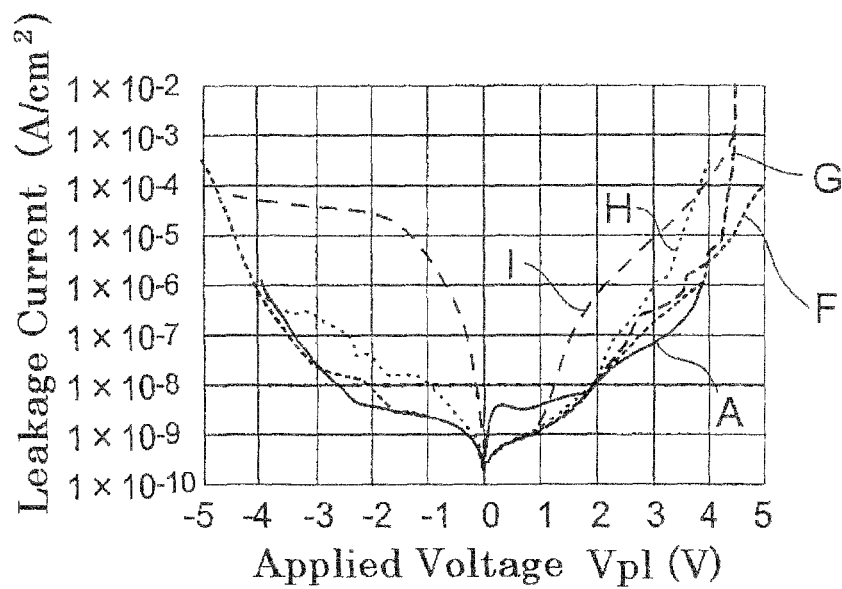
FIG. 17 is a graph showing the relationship between the applied voltage and the leakage current in the recovery test after the BT test in the samples of the second experiment.

The samples of graphs F to I, which did not fail in the BT test as shown in FIG. 16, were then subjected to measurement of the leakage current in the recovery test after the BT test. The results of the measurement are shown in FIG. 17. As understood from FIG. 17, all the samples of graphs F to I did not recover the initial leakage current characteristic of graph A, and had an unstable characteristic wherein the leakage current was unstably changed along with the change of the applied voltage.

Comparing the results of the measurement shown in FIGS. 12 to 14 in the first experiment against the results of the measurement shown in FIGS. 15 to 17 in the second experiment, the aluminum oxide having a thickness of 7 nm had a leakage current less than the leakage current of the aluminum oxide having a thickness of 5 nm, and yet the former exhibited a more unstable characteristic compared to the latter. The unstable characteristic of the 7-nm-thick aluminum oxide is considered due to the fact that a larger thickness of the aluminum oxide causes an increase in the amount of oxidized titanium oxide in the titanium nitride, i.e., bottom electrode, underlying the aluminum oxide, thereby reducing the local potential barrier.

An additional experiment, conducted after the second experiment, revealed that such an unstable characteristic occurred at a thickness of the aluminum oxide exceeding 5 nm, and that a thickness of the aluminum oxide below 5 nm provided a stable characteristic even in the case of such an aluminum oxide used in combination of the hafnium oxide and other materials as the capacitor insulation film.

Based on the above experiments, the present inventor decided to use a MIM structure for the capacitor having aluminum oxide in a capacitor insulation film, the MIM structure including a bottom electrode made of a metal or metal compound. This structure prevents degradation of the aluminum oxide and thus prevents the degradation of the semiconductor device including such a capacitor. In this structure, the aluminum oxide has a film thickness of 5 nm or below.

Figure 18:
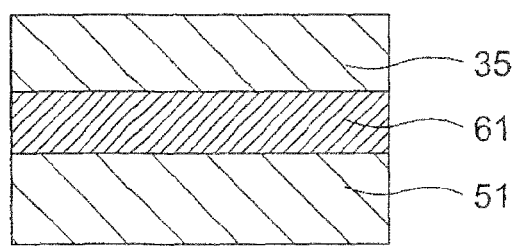
FIG. 18 is a schematic sectional view of a capacitor used in a third experiment of the present invention.

A third experiment was then conducted for comparing the results thereof against the results of the first and second experiments. In the third experiment, samples of semiconductor device were manufactured, wherein the capacitor insulation film was made from hafnium oxide having a larger dielectric constant compared to the aluminum oxide, and the bottom electrode was made from titanium nitride. FIG. 18 shows the layered structure of a capacitor 60 in the semiconductor device manufactured as samples for the third experiment.

The layered structure shown in FIG. 18 is similar to the layered structure of the capacitor 50 shown in FIG. 11 except that the capacitor insulation film 61 is made of hafnium oxide having a thickness of 7 nm and formed on a titanium nitride bottom electrode 51 in FIG. 18.

Figure 19A:
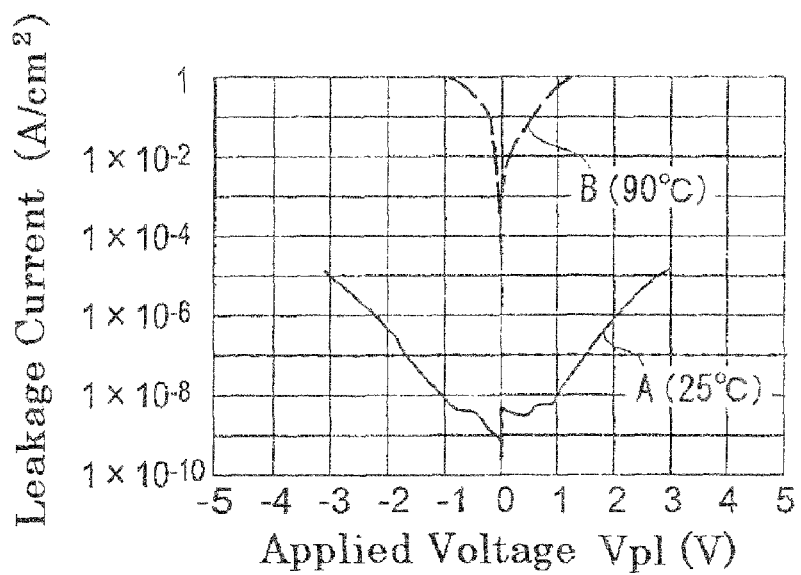
FIG. 19A to 19C are graphs showing the relationship between the applied voltage and the leakage current in the third to fifth experiments, respectively.

One of the samples of semiconductor device having the capacitor 60 was subjected to measurement in the leakage current at different temperatures. FIG. 19A shows the results thereof, wherein the sample was measured to obtain an initial leakage current characteristic at room temperature (graph A) and a subsequent leakage current characteristic at a high temperature (graph B). As understood from FIG. 19A, graph A reveals a stable leakage current characteristic and graph B reveals a substantial failure at the high temperature. Comparing the graphs A and B in FIG. 19A against the corresponding graphs A and C, respectively, in FIG. 15 showing the results of the measurement for the 7-nm-thick aluminum oxide, the samples of semiconductor device including the capacitor 60 have an unstable characteristic, wherein the leakage current changes unstably in a high temperature range.

Samples of semiconductor device including a capacitor having a 11-nm-thick hafnium oxide were manufactured and subjected to measurement of the leakage current at room temperature in a fourth experiment, which was conducted for comparing the results thereof against the results of the third experiment.

Figure 19B:
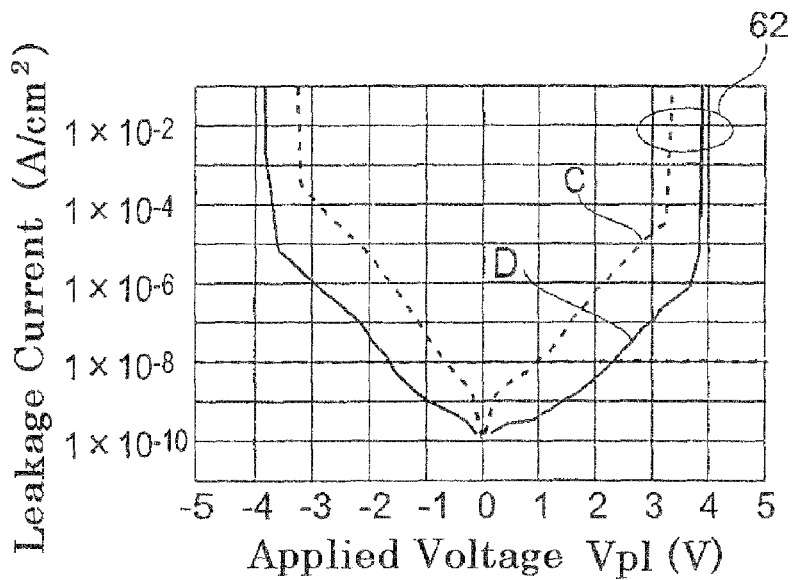

FIG. 19B shows results of the measurement (graph D) of the leakage current in one of the samples in the fourth experiment, as compared to results of the measurement (graph C) in the third experiment. As understood from FIG. 19B, graph D showing the results of the sample in the fourth experiment reduced the leakage current by about two digits than graph C of the third experiment, exhibiting the general tendency that an increased thickness of the insulator film alleviates the electric field to reduce the leakage current, However, as indicated by numeral 62, the difference in the breakdown voltage was relatively small between the two cases, wherein the increased thickness of the insulator film did not significantly increase the breakdown voltage.

A conventional capacitor insulation film such as made of silicon oxide, silicon nitride and tantalum oxide generally fails to a breakdown at a rising voltage that generates a leakage current of $1 \times 10^{-1}$ A/cm$^2$ or above therethrough and exhibits a tendency of saturation) and has a higher resistance against the breakdown along with an increased thickness thereof. On the other hand, the capacitor insulation film made of hafnium oxide has a tendency of failure to a breakdown at a voltage that generates a lower leakage current as compared to the leakage current of the conventional capacitor insulation film. Thus, the capacitor insulation film made of hafnium oxide was considered to have a particular structure unlike the structure of the conventional capacitor insulation film.

Figure 19C:
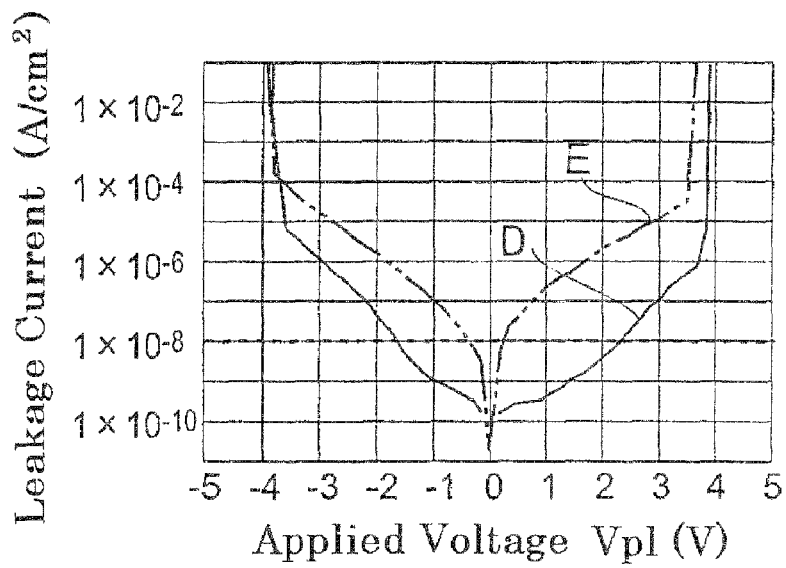

A fifth experiment was then conducted wherein a sample having a 11-nm-thick hafnium oxide was thermally treated at a temperature of 700 degrees C. in a nitrogen atmosphere for 3 minutes to completely crystallize the hafnium oxide. The resultant sample was subjected to measurement in the leakage current at room temperature. The results of the measurement are shown by graph E in FIG. 19C, as compared to the results (graph D) of the fourth experiment. As understood from FIG. 19C, the sample of fifth experiment exhibited a higher leakage current compared to the sample of the fourth experiment, exceeding a practically allowable limit of the leakage current, $1 \times 10^{-8}$ A/cm$^2$.

As described heretofore, hafnium oxide has a larger dielectric constant and yet a lower resistance against the breakdown compared to aluminum oxide. Thus, it is concluded that the hafnium oxide is not suitable to the capacitor insulation film so long as it is used as a single-layer film.

Figure 20:
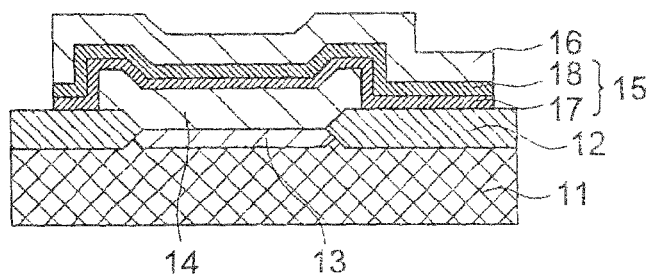
FIG. 20 is a sectional view of a capacitor in a semiconductor device according to a first embodiment of the present invention.

Now, the embodiments of the present invention are specifically described with reference to accompanying drawings. FIG. 20 shows a layer structure of a capacitor in a semiconductor device according to a to first embodiment of the present invention. The semiconductor device 10 includes a silicon substrate 11, a LOCOS film 12 formed on the silicon substrate 11 for isolation of element regions, a titanium silicide film 13 formed on the element region of the silicon substrate 11, and a layered structure of a capacitor formed on the titanium silicide film 13. The capacitor includes a bottom electrode 14 made of titanium nitride formed on the titanium silicide film 13, a capacitor insulation film 15 having a two-layer structure, and a top electrode 16 made of titanium nitride. Other insulator films and interconnect patterns are omitted for depiction in the drawing.

The titanium silicide film 13 reduces the contact resistance between the bottom electrode 14 and the silicon substrate 11. The capacitor insulation film 15 includes 4-nm-thick aluminum oxide 17 and overlying 3-nm-thick hafnium oxide 18.

In the configuration of the capacitor insulation film in the semiconductor device 10 of the present embodiment, since the aluminum oxide 17 does not necessitate a dedicated heat treatment for reducing the leakage current, the capacitor insulation film 15 has a smaller EOT to thereby increase the capacitance without affecting the characteristics of other components such as a metallic interconnect pattern which is susceptible to the heat treatment. In addition, since the aluminum oxide 17 contacts the titanium nitride bottom electrode 14, i.e., metallic bottom electrode, which does not generate therein a depletion layer, the aluminum oxide 17 will scarcely fail in the BT test or increase the leakage current.

In addition, the two-layer structure of the capacitor insulation film 15 including the hafnium oxide 18 having a larger dielectric constant achieves a larger capacitance for the capacitor.

Samples of the semiconductor device 10 of the first embodiment were manufactured by the process as described hereinafter. A LOCOS film 12 made of silicon oxide was first formed on a n-type silicon substrate 11, followed by depositing a titanium film and thermally treating the same to form a titanium silicide film 13 on the silicon surface. A titanium nitride film was then deposited thereon using a source gas including titanium tetrachloride and ammonium, and then patterned to form a bottom electrode 14.

Thereafter, a 4-nm-thick aluminum oxide film was deposited on the entire surface by a pulse-deposition technique using ozone as an oxidizing agent. Subsequently, a 3-nm-thick hafnium oxide film was deposited thereon by using a pulse-deposition technique using ozone as an oxidizing agent. A titanium nitride film was deposited thereon, followed by patterning the titanium nitride film using a photoresist mask, and patterning the aluminum oxide film and hafnium oxide film by using the patterned titanium nitride film as an etching mask. Thus, a capacitor including the bottom electrode 14, capacitor insulation film 15 and a top electrode 16 was obtained.

The semiconductor device thus manufactured exhibited an EOT of 2.39 nm for the capacitor insulation film 15, which was 50% smaller than the EOT of a capacitor insulation film made of tantalum oxide. Thus, the capacitor in the semiconductor device 10 of the present embodiment had a capacitance double the capacitance of the capacitor including the tantalum oxide. In an alternative, a stacked capacitor having the aluminum oxide can be formed in a hole having a depth half the depth of the deep hole receiving therein a stacked capacitor having the tantalum oxide and the same capacitance.

Samples of the semiconductor device 10 manufactured had different thicknesses for each of the aluminum oxide 17 and hafnium oxide 18. Those samples were subjected to evaluation for determining an optimum thickness for each of the aluminum oxide 17 and hafnium oxide 18.

In the evaluation, it was found that a combination of aluminum oxide having a thickness of 2 nm or smaller and hafnium oxide having a thickness of 6 nm or larger exhibited a larger leakage current and an unstable characteristic caused by heat etc. Another combination of aluminum oxide having a thickness of 5 nm or larger and hafnium oxide having a thickness of 3 nm or smaller exhibited a characteristic similar to that of an aluminum oxide film alone. The latter combination had an unstable characteristic such as shown by the graphs in FIGS. 15 to 17, which were obtained for 7-nm-thick aluminum oxide. This structure neither provides a smaller EOT nor a higher capacitance.

From the above results of measurement, it was determined that the aluminum oxide have a thickness of 2 to 5 nm, and that the hafnium oxide have a thickness of 3 to 6 nm, for achieving smaller EOT, reduced leakage current and stable characteristic.

Although the above embodiment used aluminum oxide 17 and overlying hafnium oxide 18 in the capacitor insulation film 15, the order of deposition may be changed without a substantial difference in the above advantage. In addition, if the deposition order is thus changed, an additional advantage may be obtained that the top electrode can be deposited without incurring scattering of hafnium oxide which would cause contamination in the semiconductor device. It is to be noted that the bottom or top electrode may have a polysilicon film on the surface of the titanium nitride film so long as the polysilicon film is not in direct contact with the aluminum oxide 17.

Figure 21:
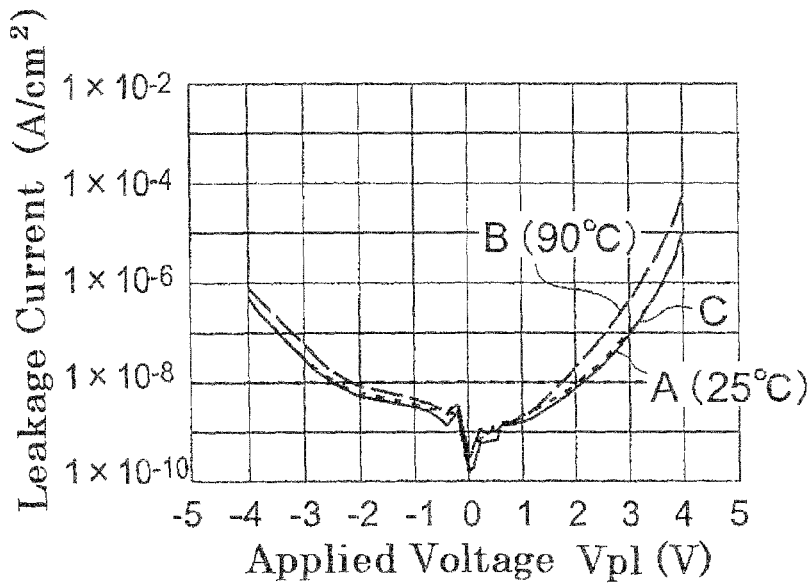
FIG. 21 is a graph showing the relationship between the applied voltage and the leakage current in a sample of the capacitor shown in FIG. 20 at different temperatures.

For further evaluation of the semiconductor device 10 of the present embodiment, another sample was subjected to a measurement wherein the n-type silicon substrate 11 was grounded, the top electrode 16 is applied with a potential which is changed from a negative potential to a positive potential, similarly to the configuration shown in FIG. 1, and the leakage current was measured. The measurement was performed at room temperature, at an elevated temperature and again at room temperature. The results of the measurement are shown in FIG. 21 similarly to FIG. 3. As understood from FIG. 21, the sample exhibited a stable characteristic at a high temperature (graph B), and no degradation of the capacitor insulation film (graph C).

Figure 22:
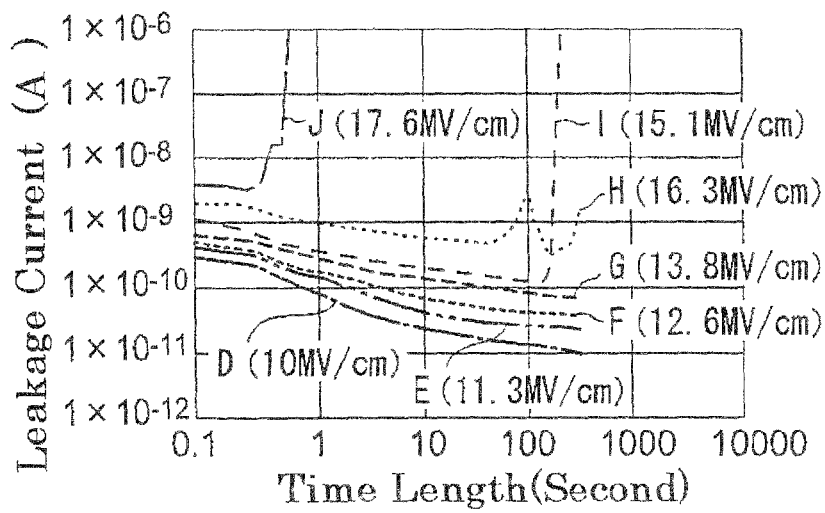
FIG. 22 is a graph showing the relationship between the time length of voltage application and the leakage current in a BT test of samples of the capacitor shown in FIG. 20.

Other samples were subjected to a BT test. The results of the BT test are shown in FIG. 22 similarly to FIG. 4. As understood from FIG. 22, all the samples, irrespective of occurring of a failure or non-failure, exhibited reduction of the leakage current along with the elapsed time length, thereby revealing substantially no degradation in the leakage current characteristic.

Figure 23:
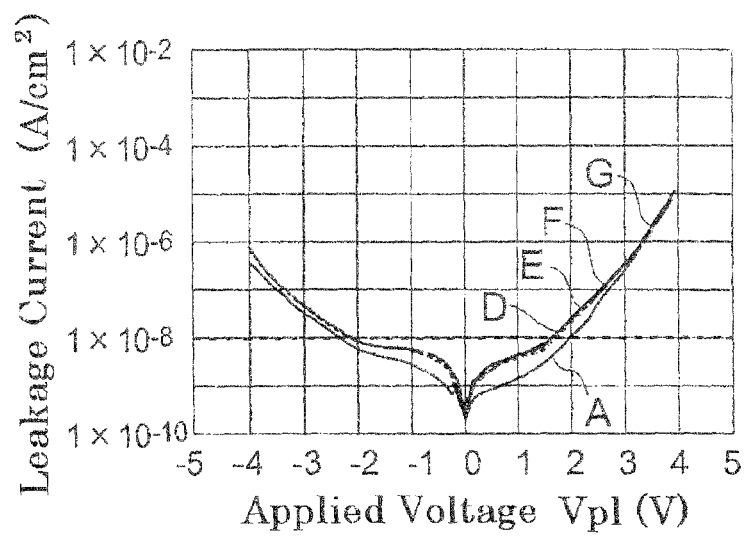
FIG. 23 is a graph showing the relationship between the applied voltage and the leakage current in the recovery test after the BT test in the capacitor shown in FIG. 20.

The samples of graphs D to G, which did not fail in the BT test as shown in FIG. 22, were subjected to a recovery test for the leakage current, the results of which are shown in FIG. 23. All these samples exhibited no degradation in the recovery test, as understood from FIG. 23.

Figure 24:
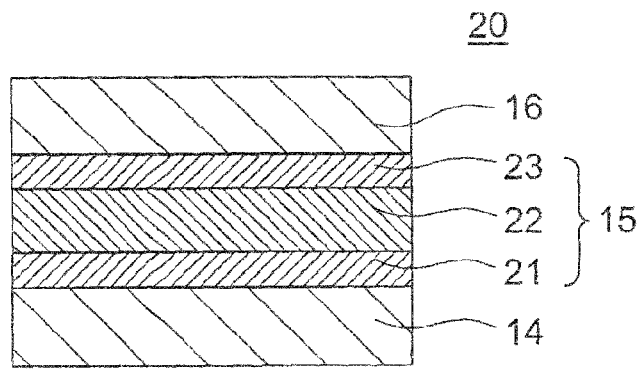
FIG. 24 is a schematic sectional view of a capacitor in a semiconductor device according to a second embodiment of the present invention.

FIG. 24 shows a layered structure of a capacitor in a semiconductor device according to a second embodiment of the present invention. The layered structure of the capacitor 20 shown in FIG. 24 is substantially similar to the layered structure of the first embodiment shown in FIG. 20 except that the capacitor insulation film 15 has a three-layer structure in FIG. 24. The capacitor insulation film 15 in the present embodiment includes 2-nm-thick aluminum oxide 21, 3-nm-thick hafnium oxide 22 and 2-nm-thick aluminum oxide 23, which are layered in this order as viewed from the bottom electrode 14. These layers 21 to 23 are deposited by a pulse-deposition technique.

In the present embodiment, the structure wherein the hafnium oxide 22 is sandwiched between aluminum oxide 21 and aluminum oxide 23 allows the hafnium oxide 22 to be apart from the metallic electrode 14 or 16, whereby the leakage current can be reduced as compared to the first embodiment. In addition, the scattering of hafnium oxide during deposition of the top electrode 16 can be avoided. If the total thickness of each of the materials in the capacitor insulation film 15 is equal to the thickness of the corresponding material in FIG. 20, a similar EOT can be obtained. The measured EOT of the capacitor insulation film 15 in the present embodiment was 2.49 nm, which is similar to the EOT measured in the first embodiment.

Figure 25:
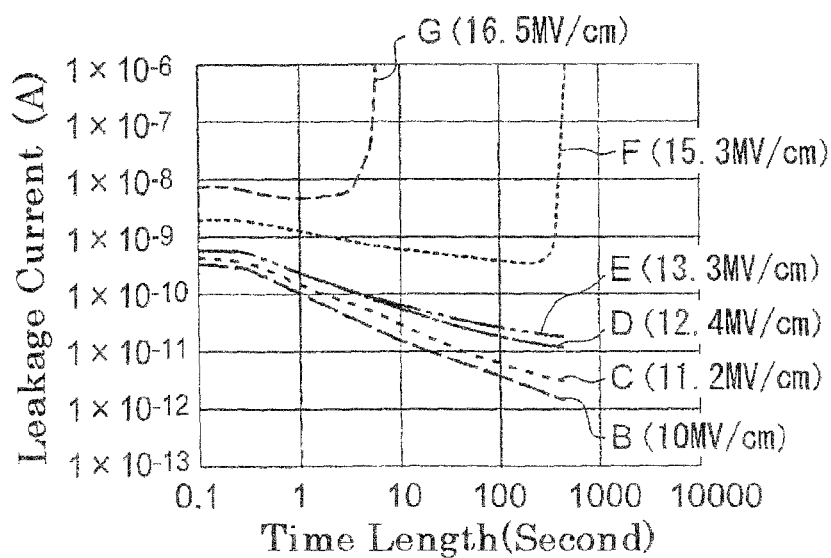
FIG. 25 is a graph showing the relationship between the time length of voltage application and the leakage current in a BT test of samples of the capacitor shown in FIG. 24.

For evaluating the semiconductor device having the capacitor 20 according to the present embodiment, samples thereof were manufactured and measured in a BT test to provide leakage current characteristics similar to those shown in FIG. 4. In FIG. 25, the samples of graphs F and G measured at electric fields equal to or exceeding 15.3 MV/cm failed in the BT test, as well as another sample measured at 14.5 MV/cm (not shown). Those samples, irrespective of occurring of a failure or non-failure, exhibited reduction of the leakage current with time, thereby revealing no degradation of the capacitor insulation film.

Figure 26:
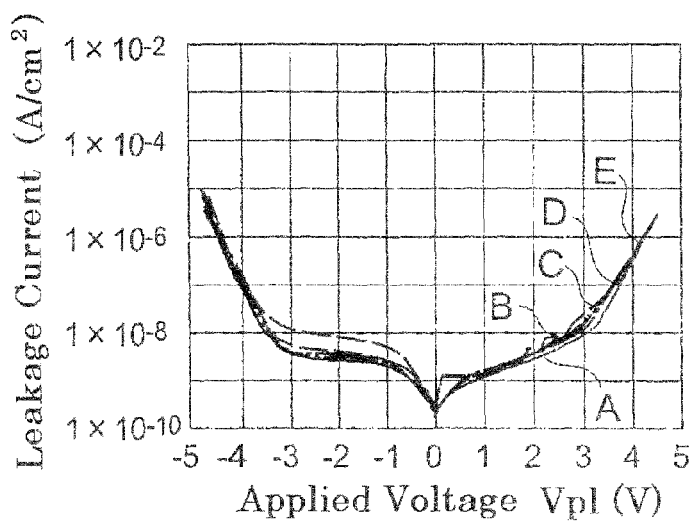
FIG. 26 is a graph showing the relationship between the applied voltage and the leakage current in the recovery test after the BT test in the capacitor shown in FIG. 24.

The samples which did not fail in the BT test were measured in a recovery test similarly to the recovery test of which data are shown in FIG. 5. The results of the recovery test are shown in FIG. 26, wherein the samples of B to E substantially recovered to the initial leakage current shown by graph A without any degradation.

It is noticed in the semiconductor device 10 of the first embodiment that the leakage current, $1 \times 10^{-5}$ A/cm$^2$, at an applied voltage of +4.0 volts was larger by one digit than the leakage current, $1 \times 10^{-6}$ A/cm$^2$, at an applied voltage of −4.0 volts, as shown in FIG. 23. On the other hand, the leakage current in the present embodiment was $3 \times 10^{-7}$ A/cm$^2$ at both +4.0 volts and −4.0 volts, showing reduction in the leakage current at both the applied voltages and especially a larger reduction at the positive applied voltage. This means a remarkable reduction is obtained in the leakage current on the side of the top electrode.

A semiconductor device of a modification from the second embodiment shown in FIG. 24 is such that the hafnium oxide 22 sandwiched between the aluminum oxide films 21 and 23 in FIG. 24 has a polycrystalline structure. The term polycrystalline structure used herein means that every measurable area has an exclusive crystalline structure and does not assume an amorphous state. The polycrystalline structure can be identified using an X-ray diffraction technique or transmission electron microscope.

In manufacture of the semiconductor device of the modification, formation of the bottom electrode 14 is followed by consecutively depositing 2-nm-thick aluminum oxide 21, 3-nm-thick hafnium oxide 22 and 2-nm-thick aluminum oxide 23, all of them in an amorphous state. Thereafter, in a nitrogen atmosphere, a heat treatment is performed at a temperature of 700 degrees C. for 3 minutes. Since the crystallizing temperature for the hafnium oxide 22 is 550 degrees C., the hafnium oxide 22 deposited is polycrystallized by the heat treatment, whereby the three-layer capacitor insulation film includes amorphous aluminum oxide 21, polycrystalline hafnium oxide 22 and amorphous aluminum oxide 23. In an alternative process, the hafnium oxide may be polycrystallized at a heat treatment after the deposition thereof or a heat treatment for depositing the titanium nitride top electrode 16.

In the semiconductor device of the modification, the polycrystalline structure of the hafnium oxide improves the withstand voltage of the capacitor insulation film. The EOT measured for the capacitor insulation film in the modification was 2.38 nm.

Figure 27:
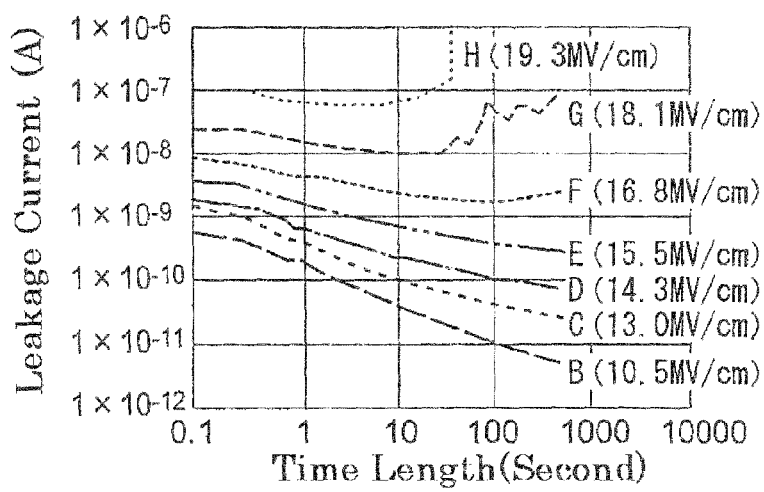
FIG. 27 is a graph showing the relationship between the time length of voltage application and the leakage current in a BT test of samples of the capacitor shown in FIG. 24.

For evaluating the semiconductor device of the modification from the second embodiment, samples thereof were manufactured and measured in the leakage current thereof using a BT test, to provide characteristics shown in FIG. 27 similar to the characteristics shown in FIG. 4. The samples of graphs G and H, which were measured at an electric field of 18.1 MV/cm or higher, failed in the BT test. In FIG. 27, other samples exhibited stable characteristic of the leakage current, which substantially remained below the leakage current at the start of the test, although some of them exhibited a moderate increase in the leakage current at a higher electric field.

In FIG. 22 showing the leakage current of the first embodiment, the samples failed at an electric field of 15.1 MV/cm or above and did not fail at an electric field below 13.8 MV/cm. In the second embodiment, the samples failed at an electric field of 14.5 MV/cm or above. On the other hand, in the modification from the second embodiment, the samples did not fail up to an electric field of 16.8 MV/cm. More specifically, the samples of the first and second embodiment had a withstand voltage of 3.3 volts whereas the samples of the modification from the second embodiment had a withstand voltage of 4.0 volts which was 0.7 volts higher than the withstand voltage of the samples of the first and second embodiments. This difference in the withstand voltage corresponds to a 100-fold difference in the lifetime of the capacitor insulator film.

Figure 28:
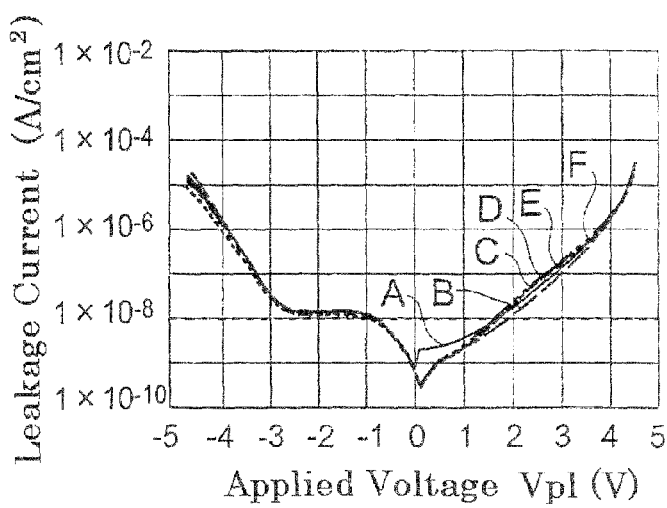
FIG. 28 is a graph showing the relationship between the applied voltage and the leakage current in the recovery test after the BT test in the samples of the capacitor shown in FIG. 24.

The samples of graphs B to F, which did not fail in the BT test as shown in FIG. 27, were measured in the recovery test to provide the leakage current characteristics, which are shown in FIG. 28 similarly to FIG. 5. These samples had substantially the initial leakage current characteristic, thereby revealing no degradation.

Figure 29:
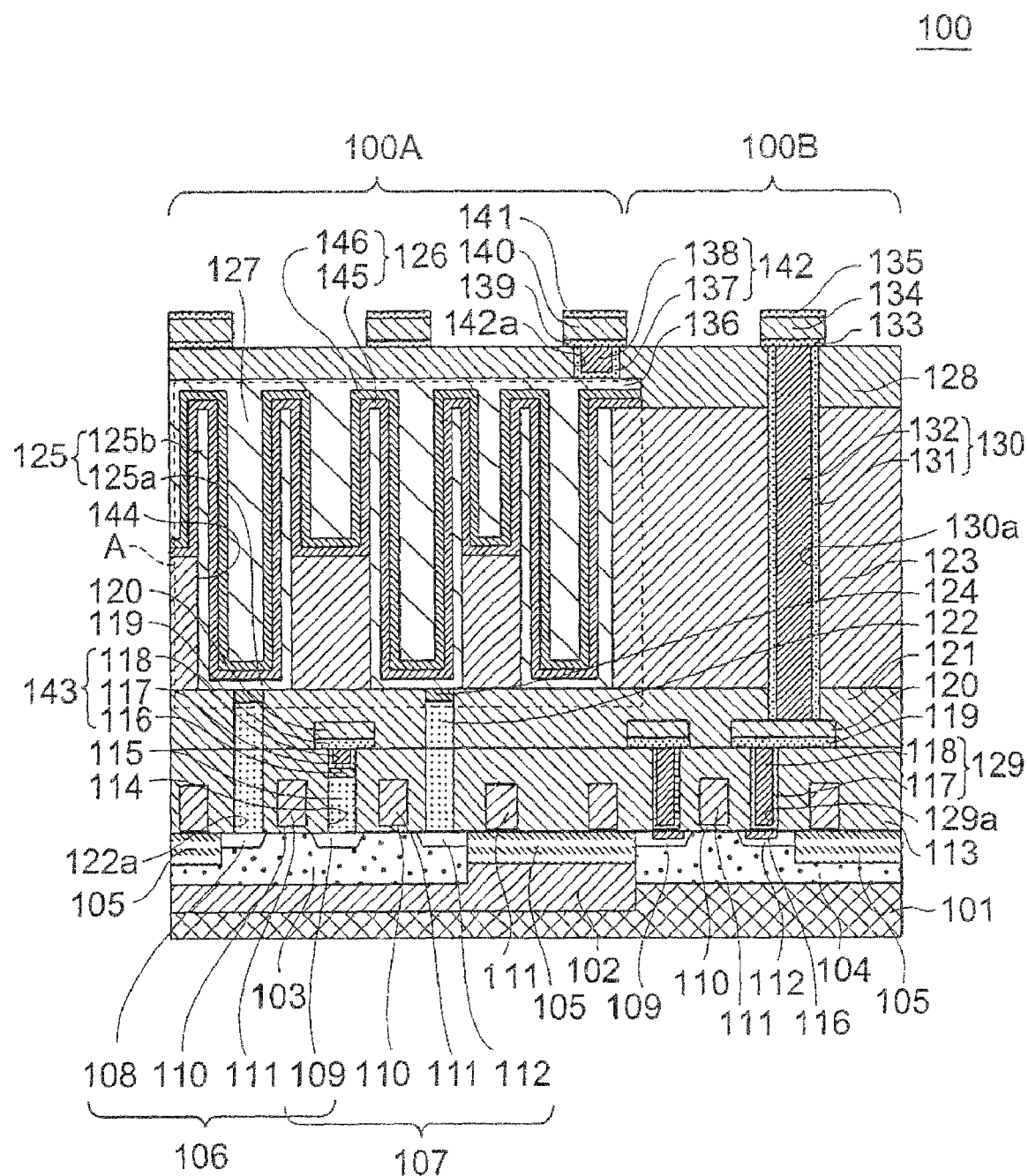
FIG. 29 is a sectional view of a semiconductor device according to a third embodiment of the present invention.

FIG. 29 shows a semiconductor device according to a third embodiment of the present invention. The semiconductor device 100 configures a DRAM device including a memory cell area 100A wherein a plurality of memory cells are arranged in a matrix on a p-type silicon substrate 101. The silicon substrate 101 includes an n-well 102 in the surface region thereof, and a first p-well 103 in the surface region of the n-well 102. The DRAM device 100 also includes a peripheral circuit area 100B, wherein the silicon substrate 101 includes a second p-well 104 in the surface region thereof, the second p-well 104 being isolated from the first p-well 103 by an element isolation area 105.

Switching transistors 106, 107 each configuring a memory cell are formed on the first p-well 103. Transistor 106 includes a drain 108, a source 109, and a gate electrode 111 formed on the silicon substrate 101 with an intervention of a gate insulation film 110. Transistor 107 includes the source 109 provided in common with transistor 106, a drain 112 and a gate electrode 111 formed on the silicon substrate 101 with an intervention of a gate insulation film 110. A first interlevel dielectric film 113 overlies transistors 106, 107.

The first interlevel dielectric film 113 has therein contact holes 114 filled with polysilicon contact plugs 115 having a bottom in contact with the source 109. On the first interlevel dielectric film 113 is formed bit lines including tungsten nitride 119 and overlying tungsten 120, each bit lines being in contact with the top of the polysilicon contact plug 115 with an intervention of a bit contact 143. The bit contact 143 includes titanium silicide 116 in contact with the top of the contact plug 115, titanium nitride 117 in contact with the titanium silicide 116 and the sidewall of the contact holes 114, and a tungsten plug 118 filling the contact holes 114 with an intervention of the titanium nitride 117. On the first interlevel dielectric film 113 is formed a second interlevel dielectric film 121 overlying the bit lines.

Contact holes 122a penetrate the first and second interlevel dielectric films 113, 121 to reach drains 108, 112. The contact holes 122a are filled with silicon plugs 122 and metal silicide 124 which is formed adjacent to the opening of the contact holes 122a.

On the second interlevel dielectric film 121 is formed a third interlevel dielectric film 123 having a top surface lower in the memory cell area 100A than in the peripheral circuit area 100B. The third interlevel dielectric film 123 has therein deep holes 144 exposing therethrough the top of the contact plugs 122. The deep holes 144 have a cross section of an ellipse close to a circle. The third interlevel dielectric film 123 has therein a dummy groove which encircles the memory cell area 100A.

The deep holes 144 receive therein bottom electrodes 125 of a pseudo-crown shape each having a bottom portion 125a flush with the bottom of the deep hole 144 and a cylindrical portion 125b extending upward from the bottom portion 125a within the deep hole 144 to protrude therefrom. A capacitor insulation film 126 is deposited on the surface of the bottom electrodes 125 and the third interlevel dielectric film 123, the capacitor insulation film 126 having a two-layer structure including 4-nm-thick aluminum oxide 145 and overlying 3-nm-thick hafnium oxide 146.

A top electrode 127 is deposited within each of the deep holes 144 and on the third interlevel dielectric film 123 via the capacitor insulation film 126. The top electrode 127 has a top surface higher in the memory cell area 100A than in the peripheral circuit area 100B. The bottom electrode 125, capacitor insulation film 126 and top electrode 127 configure a stacked cell capacitor. The capacitor insulation film 126 and top electrode 127 extend from the memory cell area 100A toward the peripheral circuit area 100B, the extended portion of the top electrode 127 configuring a lead interconnect 136 in the peripheral circuit area 100B.

On the third interlevel dielectric film 123 and top electrodes 127 is formed a fourth interlevel dielectric film 128, which has therein through-holes 142a filled with via-plugs 142 having a bottom in contact with the lead interconnect 136. The via-plugs 142 each includes titanium nitride 137 formed on the sidewall and bottom of the through-hole 142a, and tungsten 138 filling the through-hole 142 via the titanium nitride 137.

Transistors configuring the peripheral circuit and including sources 109, drains 112 and gate electrodes 110 are formed on the second p-well 104 in the peripheral circuit area 100B. The first interlevel dielectric film 113 has therein contact holes 129a filled with contact plugs 129 in contact with the source 109 and drains 112. The contact plugs 129 include titanium nitride 117 formed on the sidewall and bottom of the contact holes 129a and tungsten 118 filling the contact holes 129a via the titanium nitride 117. The contact plugs 129 contact the sources 109 and drains 112 via titanium silicide 116 formed on the top surface of the sources 109 and drains 112.

On the first interlevel dielectric film 113 are formed first-layer interconnects including titanium nitride 119 and tungsten 120 and contacting the contact plugs 129. The first-layer interconnects are covered with the second interlevel dielectric film 121.

Through-holes 130a filled with via plugs 130 contacting the first-layer interconnects are formed in the second to fourth interlevel dielectric film 121, 123, 128. The via plugs 130 include titanium nitride 131 formed on the sidewall and bottom of the through-holes 130a and tungsten 132 filling the through-holes 130a via the titanium nitride 131.

On the fourth interlevel dielectric film 128 are formed second-layer interconnects including titanium nitride 133, 139, aluminum 134, 140 and titanium nitride 135, 140, which are consecutively layered on the via plugs 130, 142. The semiconductor device 100 includes other components such as insulator films, plugs and interconnects not shown in the figure.

FIG. 30A to 30G show consecutive steps of a process for fabricating the semiconductor device shown in FIG. 29. These figures correspond to the portion encircled by dotted line denoted by "A" in FIG. 29. First, transistors each including a gate electrode, a source and a drain are formed on the silicon substrate, followed by forming a first interlevel dielectric film covering the transistors on the silicon substrate.

Thereafter, a second interlevel dielectric film 201 is deposited on the first interlevel dielectric film, and contact holes 202a are formed in the first and second interlevel dielectric films 201 for exposing therethrough drains. Subsequently, polysilicon doped with phosphorous is deposited on the entire surface so as to fill the contact holes 202a, and is subjected to a CMP treatment for removing the deposited polysilicon to leave a portion of the polysilicon within the contact holes 202a, thereby forming contact plugs 202.

Figure 30A:
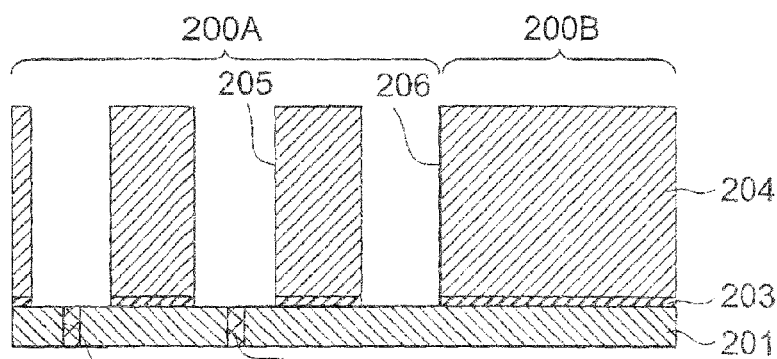
FIGS. 30A to 30G are sectional views of the semiconductor device of FIG. 29 in consecutive steps of fabrication process thereof.
Figure 30B:
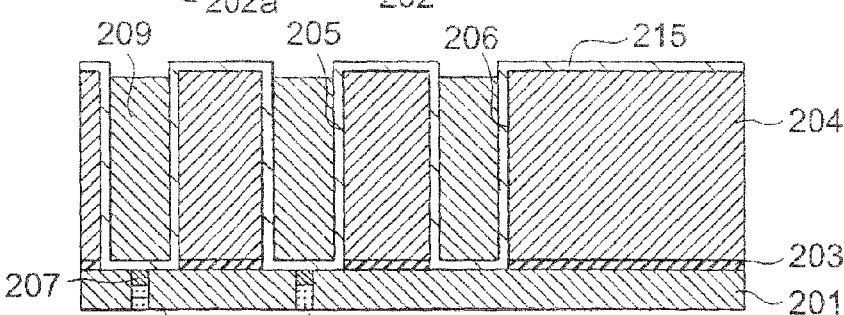

Thereafter, silicon nitride and silicon oxide are consecutively deposited on the entire surface to form third and fourth interlevel dielectric films 203, 204, respectively, by using a known CVD technique. The third and fourth interlevel dielectric films 203, 204 thus deposited are selectively etched to form deep holes 205 for exposing top of the silicon plugs 202. The deep holes 205 are configured to have a cross section of ellipse, which is close to a circle. In this step, a dummy groove 206 encircling the memory cell area 100A is formed at the same time. The resultant structure is shown in FIG. 30A.

Thereafter, titanium is deposited using a CVD technique while reacting the same with the silicon plug 202 at the top thereof. This step provides titanium silicide 207 on top of the silicon plugs 202 and deposits 20-nm-thick titanium nitride 215. The deposition of the titanium nitride in this CVD step uses reaction between titanium tetrachloride and ammonium. In an alternative, a pulse-deposition process may be used instead of the ordinary CVD process similarly to the process for deposition of the aluminum oxide. Subsequently, the deep holes 205 and dummy groove 206 are selectively filled with insulator film 209 such as made of photoresist by using a known photolithographic process, thereby obtaining the structure shown in FIG. 30B.

Thereafter, the exposed portion of the titanium nitride 215 is removed using dry-etching to leave a portion of the titanium nitride 215 on the sidewall and bottom of the deep holes 205, thereby configuring cylindrical portion 208b and bottom portion 208a of the bottom electrode 208. Subsequently, the insulator film 209 is removed from the deep holes 205 and dummy groove 206 by using an etchant, thereby obtaining the structure shown in FIG. 3C wherein the inner surface of the bottom electrode 208 is entirely exposed. It should be noted that if the aspect ratio of the deep holes 205, which is defined by the ratio of the depth to the diameter or minor axis of the deep holes 205, is higher than 7, the titanium nitride 208 configuring the bottom portion 208b is scarcely etched. Accordingly, formation of the insulator film 209 filling the deep holes 205 and dummy groove 206 may be omitted in the fabrication process.

Figure 30C:
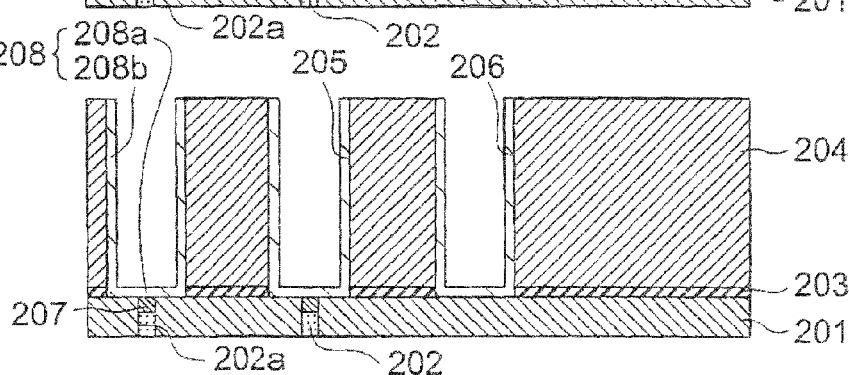
Figure 30D:
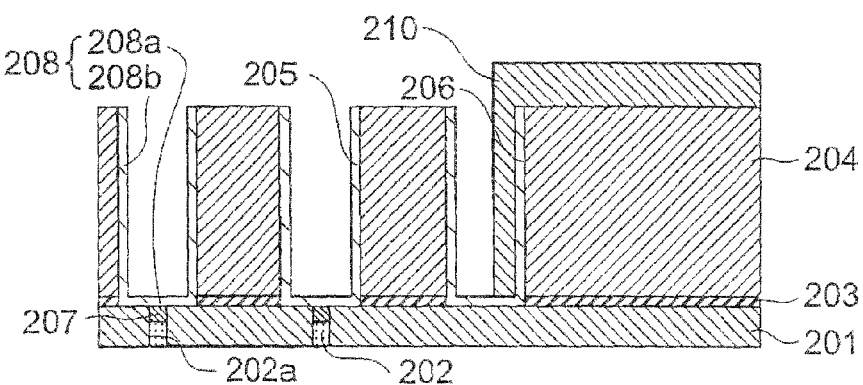

Thereafter, the peripheral circuit area 200B together with the vicinity thereof is covered with photoresist 210 so that the edge of the photoresist 200 is located within the dummy groove 206, as shown in FIG. 30D. Subsequently, a wet etching process is performed using a hydrofluoric acid solution to remove the exposed portion of the fourth interlevel dielectric film 204 by around a half thickness thereof. This step allows the bottom electrode 208 to protrude from the fourth interlevel dielectric film 204, whereby around a half of the outer surface of the bottom electrode 208 is exposed from the fourth interlevel dielectric film 204.

After removing the photoresist 210, a pulse-deposition process is performed using an organic aluminum compound as a source material and ozone as an oxidizing agent to deposit 4-nm-thick aluminum oxide 211. Further another pulse-deposition process is performed using an organic hafnium compound as a source material and ozone as an oxidizing agent to deposit 3-nm-thick hafnium oxide. These pulse-deposition steps provide a capacitor insulation film 213 including aluminum oxide 211 and overlying hafnium oxide 212, as shown in FIG. 30F.

Thereafter, a CVD step is performed to deposit titanium nitride 214 on the entire surface including the internal of the deep holes 205. The deposited titanium nitride 214 is patterned to form top electrodes 214 in the memory cell area 200A and interconnects in the peripheral circuit area 200B. Other components such as insulator films, interconnects and plugs are formed using known steps to finish the DRAM device.

The top electrode 214 may be formed by an alternative step wherein titanium nitride is deposited using a CVD technique, followed by sputtering titanium nitride or tungsten onto the deposited titanium nitride. Or else, the top electrode 214 may be formed using a pulse-deposition technique, whereby the top electrode 214 can be formed in an excellent step coverage to achieve a finer structure for the cell capacitor.

The capacitor insulation film may have a three-layer structure instead of the two-layer structure. In addition, the hafnium oxide may be formed as a polycrystalline film.

Figure 31:
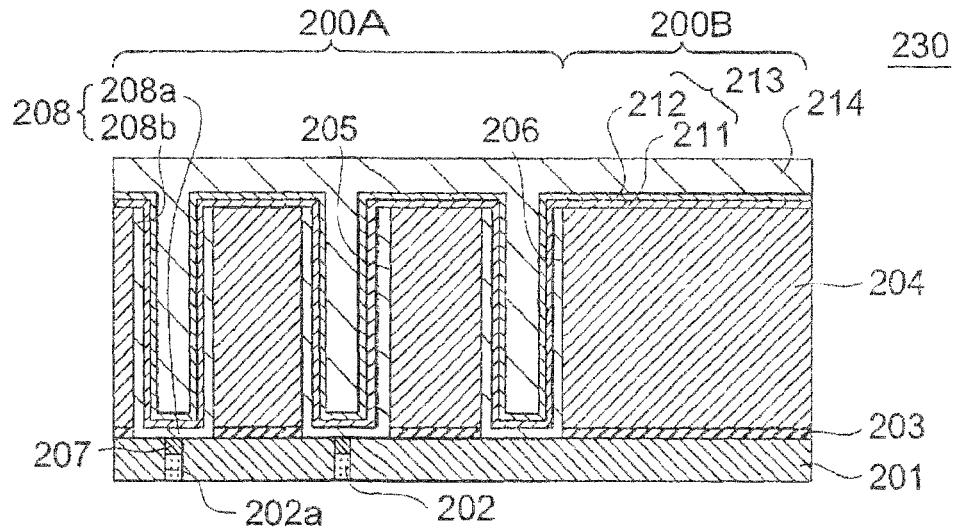
FIG. 31 is a semiconductor device according to a first modification from the third embodiment.

FIG. 31 shows a semiconductor device according to a first modification from the third embodiment. In the semiconductor device 230 of FIG. 31, the fourth interlevel dielectric film 204 has an equal top level between the memory cell area 200A and the peripheral circuit area 200B, the cylindrical portion 208b of the bottom electrode 208 does not protrude from the fourth interlevel dielectric film 204, and is formed only on the sidewall of the deep holes 205. Other configurations are similar to the semiconductor device of the third embodiment.

Figure 30E:
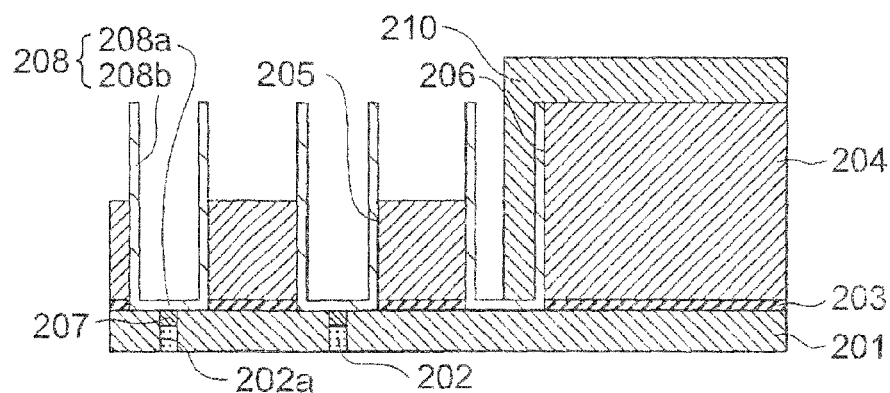
Figure 30F:
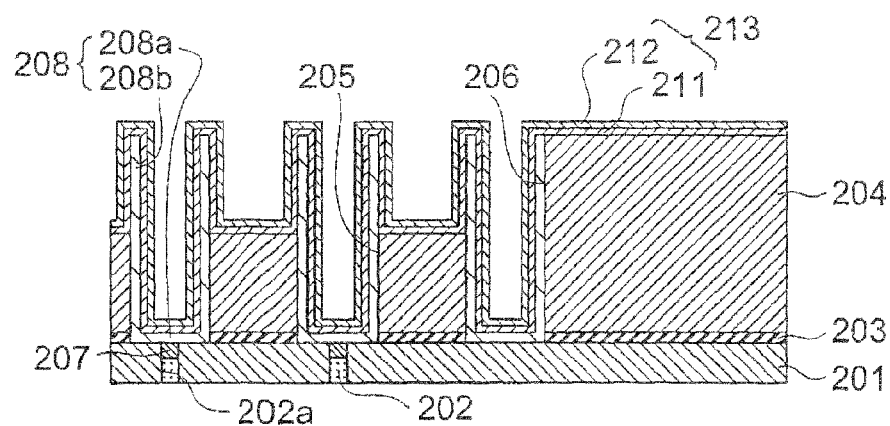
Figure 30G:
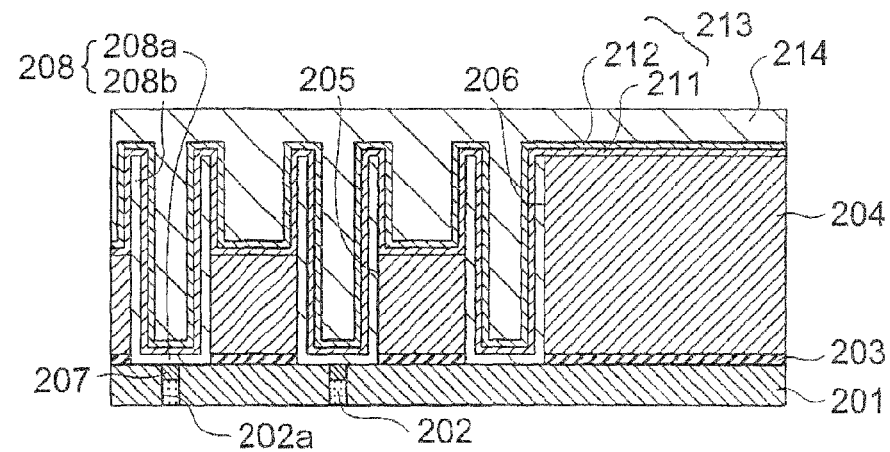

In manufacture of the first modification from the third embodiment, the photoresist forming step and the etching step for the fourth interlevel dielectric film 204, shown in FIGS. 30D and 30E, are not performed whereby the capacitor insulation film 213 is formed immediately after the step of FIG. 30C. The structure wherein the bottom electrode 208 does not protrude from the fourth interlevel dielectric film 204 in the fabrication process prevents the bottom electrode 208 from being collapsed during the fabrication process whereas the resultant capacitor has a lower capacitance than that of the third embodiment.

Figure 32:
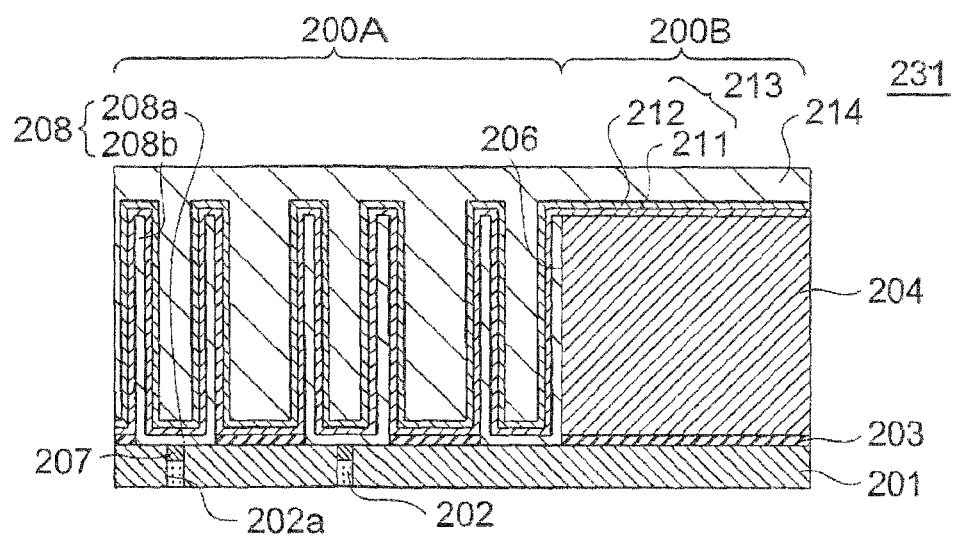
FIG. 32 is a semiconductor device according to a second modification from the second embodiment.

FIG. 32 shows a second modification from the third embodiment. In the semiconductor device 231 of the second modification shown in FIG. 32, the fourth interlevel dielectric film 204 is entirely removed in the memory cell area 200A, thus the bottom electrode 208 has a crown structure. In addition, the external surface of the cylindrical portion 208b is substantially entirely covered by the capacitor insulation film 213, and a portion of the aluminum oxide 211 is in contact with the third interlevel dielectric film 203. The structure of the second modification allows the capacitor to have a higher capacitance. The second modification can be formed by removing all of the fourth interlevel dielectric film 204 in the step of FIG. 30E.

Figure 33:
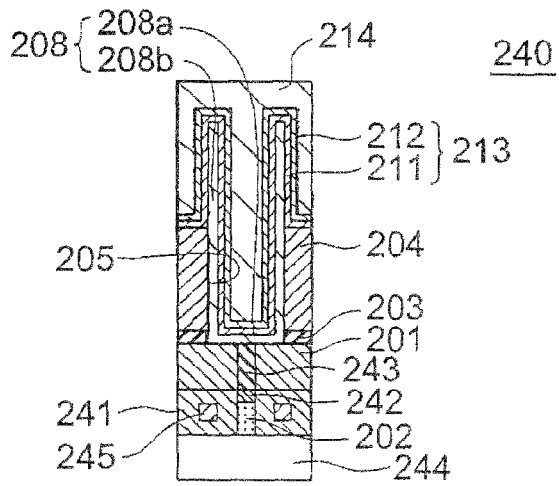
FIG. 33 is a semiconductor device according to a third modification from the second embodiment.

FIG. 33 shows a third modification from the third embodiment. In the semiconductor device 240 of the third modification shown in FIG. 33, the top portion of the silicon plugs 202 is made of metallic silicide 242, and the contact holes 202a formed in the second interlevel dielectric film 201 are filled with metallic plugs 243. In the structure of the third modification, the titanium nitride configuring the bottom electrodes 208 is connected to the silicon plugs 202 via the metallic plugs 243 and metal silicide 242, thereby reducing the contact resistance between the bottom electrodes 208 and the silicon plugs 202. This allows the semiconductor device to have a higher operational speed.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a stacked capacitor in a semiconductor device, consecutively comprising:
    forming a bottom electrode including a metal or a metal compound overlying a substrate;
    forming a capacitor insulation film on said bottom electrode, said capacitor insulation film including a first aluminum oxide film, a hafnium oxide film and a second aluminum oxide film in this order as viewed from said bottom electrode; and
    forming a top electrode including a metal or a metal compound on said capacitor insulation film,
    wherein said capacitor insulation film forming step consecutively includes depositing said first aluminum oxide film, depositing said hafnium oxide film in an amorphous state, depositing said second aluminum oxide film, and polycrystallizing said deposited hafnium oxide film.

2. The method according to claim 1, wherein a sum of thicknesses of said first and second aluminum oxide films is 2 to 5 nm.

3. The method according to claim 1, wherein said hafnium oxide film has a thickness of 3 to 6 nm.

4. The method according to claim 1, said method further consecutively comprising:
- forming a metal silicide layer overlying said semiconductor substrate; and
- then forming said stacked capacitor directly on said metal silicide layer.

5. A method for manufacturing a stacked capacitor in a semiconductor device, consecutively comprising:
- forming a bottom electrode including a metal or a metal compound overlying a substrate;
- forming a capacitor insulation film on said bottom electrode, said capacitor insulation film including a first aluminum oxide film, a hafnium oxide film and a second aluminum oxide film in this order as viewed from said bottom electrode; and
- forming a top electrode including a metal or a metal compound on said capacitor insulation film,
- wherein said capacitor insulation film forming step consecutively includes depositing said first aluminum oxide film, depositing said hafnium oxide film in an amorphous state, polycrystallizing said deposited hafnium oxide film, and depositing said second aluminum oxide film.

6. A method for manufacturing a stacked capacitor in a semiconductor device, consecutively comprising:
- forming a bottom electrode including a metal or a metal compound overlying a substrate;
- forming a capacitor insulation film on said bottom electrode, said capacitor insulation film including a first aluminum oxide film, a hafnium oxide film and a second aluminum oxide film in this order as viewed from said bottom electrode; and
- forming a top electrode including a metal or a metal compound on said capacitor insulation film,
- wherein said capacitor insulation film forming step includes depositing said hafnium oxide film in an amorphous state, and said top electrode forming step includes polycrystallizing said deposited hafnium oxide film.

* * * * *